(12) United States Patent
Usui et al.

(10) Patent No.: US 10,453,776 B2
(45) Date of Patent: Oct. 22, 2019

(54) SEMICONDUCTOR DEVICE

(71) Applicant: Panasonic Intellectual Property Management Co., Ltd., Osaka (JP)

(72) Inventors: Ryosuke Usui, Osaka (JP); Tetsuzo Ueda, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 507 days.

(21) Appl. No.: 15/196,153

(22) Filed: Jun. 29, 2016

(65) Prior Publication Data
US 2016/0307822 A1 Oct. 20, 2016

Related U.S. Application Data

(63) Continuation of application No. PCT/JP2015/000026, filed on Jan. 7, 2015.
(Continued)

(51) Int. Cl.
H01L 23/10 (2006.01)
H01L 23/34 (2006.01)
H01L 23/473 (2006.01)
H01L 23/495 (2006.01)
H02M 7/48 (2007.01)
(Continued)

(52) U.S. Cl.
CPC .......... H01L 23/473 (2013.01); H01L 23/053 (2013.01); H01L 23/49562 (2013.01); H01L 23/528 (2013.01); H01L 28/40 (2013.01); H02M 7/48 (2013.01); H05K 7/20927 (2013.01); H01L 2924/0002 (2013.01)

(58) Field of Classification Search
CPC ..... H01L 25/00; H01L 27/0629; H01L 23/34; H01L 23/427; H01L 23/3672; H01L 2224/48195; H01L 23/473
USPC ....... 257/686, 706, 707, 777, 691, 714, 723, 257/724
See application file for complete search history.

(56) References Cited

U.S. PATENT DOCUMENTS

| 5,132,896 A | 7/1992 | Nishizawa et al. |
| 7,504,720 B2 * | 3/2009 | Nakatsu ............. H01L 23/3675 257/712 |

(Continued)

FOREIGN PATENT DOCUMENTS

| JP | H03-285570 A | 12/1991 |
| JP | 2005-073374 | 3/2005 |

(Continued)

OTHER PUBLICATIONS

International Search Report of PCT application No. PCT/JP2015/000026 dated Mar. 24, 2015.

*Primary Examiner* — S. V. Clark
(74) *Attorney, Agent, or Firm* — McDermott Will & Emery LLP

(57) ABSTRACT

A semiconductor device includes a semiconductor module including a semiconductor element, a passive element, a cooling member, a first conductive member and a second conductive member. The cooling member is disposed between the semiconductor module and the passive element. And a first conductive member and a second conductive member electrically connect the semiconductor module and the passive element. Furthermore, two or more aspects of at least one of the first conductive member and the second conductive member face the cooling member.

12 Claims, 22 Drawing Sheets

Related U.S. Application Data

(60) Provisional application No. 61/927,983, filed on Jan. 16, 2014, provisional application No. 61/927,982, filed on Jan. 16, 2014.

(51) Int. Cl.
- *H01L 23/053* (2006.01)
- *H01L 23/528* (2006.01)
- *H01L 49/02* (2006.01)
- *H05K 7/20* (2006.01)

(56) References Cited

U.S. PATENT DOCUMENTS

| | | | | |
|---|---|---|---|---|
| 8,355,244 | B2 * | 1/2013 | Kimura | H05K 7/209 257/707 |
| 9,030,006 | B2 * | 5/2015 | Chow | H01L 21/563 257/666 |
| 2006/0291261 | A1 | 12/2006 | Ohnishi et al. | |
| 2008/0049476 | A1 | 2/2008 | Azuma et al. | |
| 2008/0130223 | A1 | 6/2008 | Nakamura et al. | |
| 2008/0272484 | A1 * | 11/2008 | Myers | H01L 23/473 257/714 |
| 2010/0259898 | A1 | 10/2010 | Kimura et al. | |
| 2011/0242761 | A1 | 10/2011 | Tonomoto | |
| 2013/0264891 | A1 | 10/2013 | Sawada et al. | |
| 2018/0332739 | A1 * | 11/2018 | Takeuchi | H05K 7/20927 |

FOREIGN PATENT DOCUMENTS

| | | |
|---|---|---|
| JP | 2005-151747 | 6/2005 |
| JP | 2006-339222 | 12/2006 |
| JP | 2008-118753 | 5/2008 |
| JP | 2010-252461 | 11/2010 |
| JP | 2011-228638 | 11/2011 |
| JP | 2012-055163 A | 3/2012 |
| JP | 2012-115093 | 6/2012 |
| JP | 2013-211326 | 10/2013 |
| JP | 2013-219892 | 10/2013 |
| WO | 2013/118223 A1 | 8/2013 |

* cited by examiner

SEMICONDUCTOR DEVICE

BACKGROUND

1. Technical Field

The present disclosure relates to a semiconductor device used for power conversion in an inverter device or the like.

2. Description of the Related Art

In recent years, there is used an inverter circuit which is based on semiconductor modules in which an IGBT (Insulated Gate Bipolar Transistor) element and the like are incorporated, for driving an electric motor of an electric car, a hybrid car or the like. However, since these semiconductor modules are operated with a large current, a great amount of heat is generated. Accordingly, there may be caused a problem that a capacitor, a control circuit and the like installed in the vicinity are placed at a high temperature, resulting in malfunction.

Unexamined Japanese Patent Publication No. 2010-252461 discloses a power conversion device according to which a cooler is disposed between a semiconductor module and a capacitor, and a capacitor terminal connecting the capacitor and a semiconductor element is thermally in contact with the cooler so as to cool the capacitor terminal. Heat transfer from the semiconductor module to the capacitor is thereby suppressed, and an increase in the temperature of the capacitor is reduced.

Furthermore, Unexamined Japanese Patent Publication No. 2005-73374 discloses a power conversion device which places a semiconductor module between refrigerant tubes and cools the semiconductor module so as to reduce harmful effect and the like of heat on other devices.

SUMMARY

A first semiconductor device according to the present disclosure includes a semiconductor module including a semiconductor element, a passive element, a cooling member, a first conductive member and a second conductive member. The cooling member is disposed between the semiconductor module and the passive element. The first conductive member and the second conductive member electrically connect the semiconductor module and the passive element. Furthermore, two or more aspects of at least one of the first conductive member and the second conductive member face the cooling member.

According to the configuration, compared to a case where only one aspect of a conductive member faces a cooling member, heat dissipation from the conductive member, which is electrically connecting the semiconductor module and the passive element, to the cooling member is promoted. And heat transferred from the semiconductor module to the passive element through the conductive member may be suppressed. Accordingly, an increase in the temperature of the passive element due to heat from the semiconductor module may be suppressed.

Furthermore, a second semiconductor device according to the present disclosure includes a semiconductor module including a semiconductor element, a passive element, a cooling member, a first conductive member and a second conductive member. The cooling member is disposed between the semiconductor module and the passive element. The first conductive member and the second conductive member electrically connect the semiconductor module and the passive element. The cooling member and the semiconductor module are disposed between the first conductive member and the second conductive member.

According to the configuration, the conductive members connecting the semiconductor module and the passive element are cooled by the cooling member disposed between the two conductive members. Therefore, an increase in the temperature of the passive element due to the heat from the semiconductor module is suppressed. Also, since the two conductive members connect the semiconductor module and the passive element from both sides of the cooling member, the conductive members do not need to make a detour through the cooling member and the passive element. Accordingly, the lengths of the conductive members may be made short. An increase in inductance may thereby be suppressed.

Moreover, a third semiconductor device according to the present disclosure includes a first semiconductor module including a first semiconductor element, a second semiconductor module including a second semiconductor element, and a cooling member where the first semiconductor module and the second semiconductor module are installed. The first semiconductor module and the second semiconductor module are installed on a side surface of the cooling member. The first semiconductor module includes a first power terminal and a second power terminal that are electrically connected to the first semiconductor element and that protrude from the first semiconductor module. And the second semiconductor module includes a third power terminal and a fourth power terminal that are electrically connected to the second semiconductor element and that protrude from the second semiconductor module. The second power terminal of the first semiconductor module is connected to the third power terminal of the second semiconductor module. The third power terminal of the second semiconductor module protrudes from the second semiconductor module, at a position facing the side surface of the cooling member.

According to the configuration, cooling may be performed also by the power terminals protruding from the semiconductor module, at a position facing the side surface of the cooling member. Therefore, a plurality of semiconductor modules connected to each other may be sufficiently cooled. In addition, since the semiconductor modules may be electrically connected over a short distance, an increase in inductance may be suppressed.

DESCRIPTION OF EMBODIMENTS

First, problems of conventional techniques will be described.

According to the power conversion device disclosed in Unexamined Japanese Patent Publication No. 2010-252461, one of two capacitor terminals is solely disposed between a semiconductor module and a capacitor, and the other capacitor terminal is not sufficiently cooled. Also, in order to increase a thermal contact area between the capacitor terminal and the cooler, the capacitor terminal is extended between the semiconductor module and the capacitor. As a result, there is a new problem that the length of the capacitor terminal is increased, and consequently the inductance is increased.

On the other hand, according to the power conversion device disclosed in Unexamined Japanese Patent Publication No. 2005-73374, a terminal of the semiconductor module protruding from between the refrigerant tubes is connected at a power wiring portion disposed on the terminal, and thus heat dissipation from the terminal to the refrigerant tubes is not enough. Also, the wiring length is increased, causing the inductance to increase.

The present disclosure provides a semiconductor device that suppresses an increase in the temperature of other electronic devices, such as a capacitor, caused by generation of heat by a semiconductor module. There is also provided a semiconductor device that suppresses an increase in the inductance caused by the length of a conductive member between semiconductor modules. The semiconductor device of the present disclosure may be suitably used for power conversion by an inverter circuit or the like.

Hereinafter, each exemplary embodiment will be described with reference to the drawings.

First Exemplary Embodiment

A configuration of a semiconductor device according to a first exemplary embodiment will be described with reference to FIGS. 1A to 4.

Figure 1A:
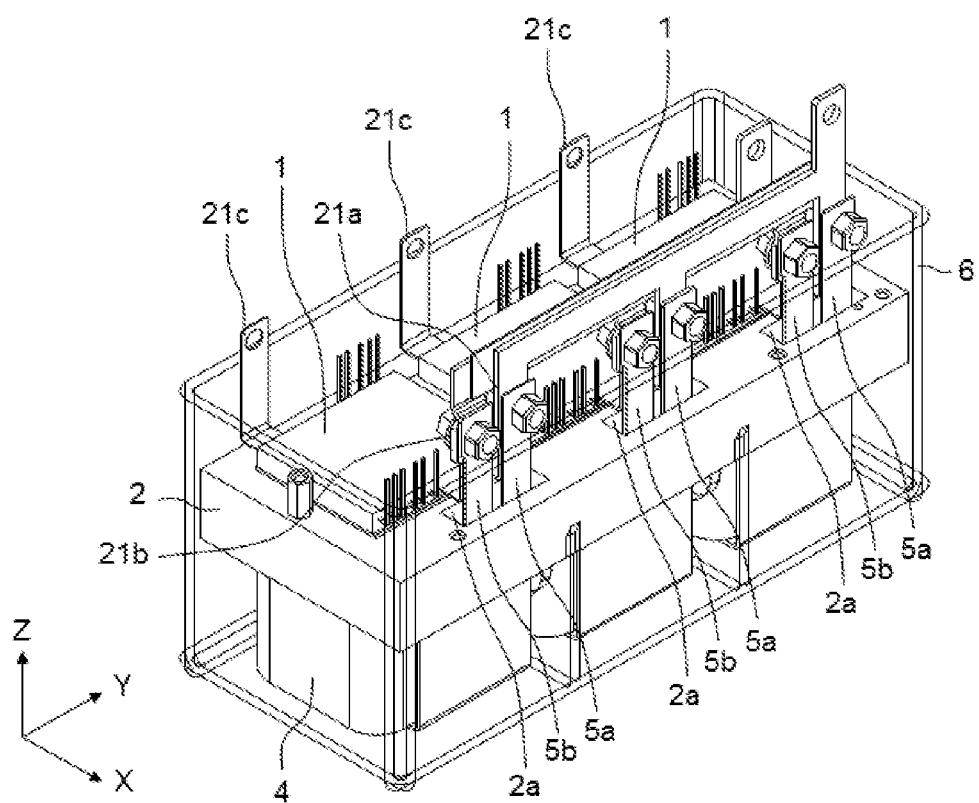
FIG. 1A is a schematic perspective view of a semiconductor device according to a first exemplary embodiment.
Figure 1B:
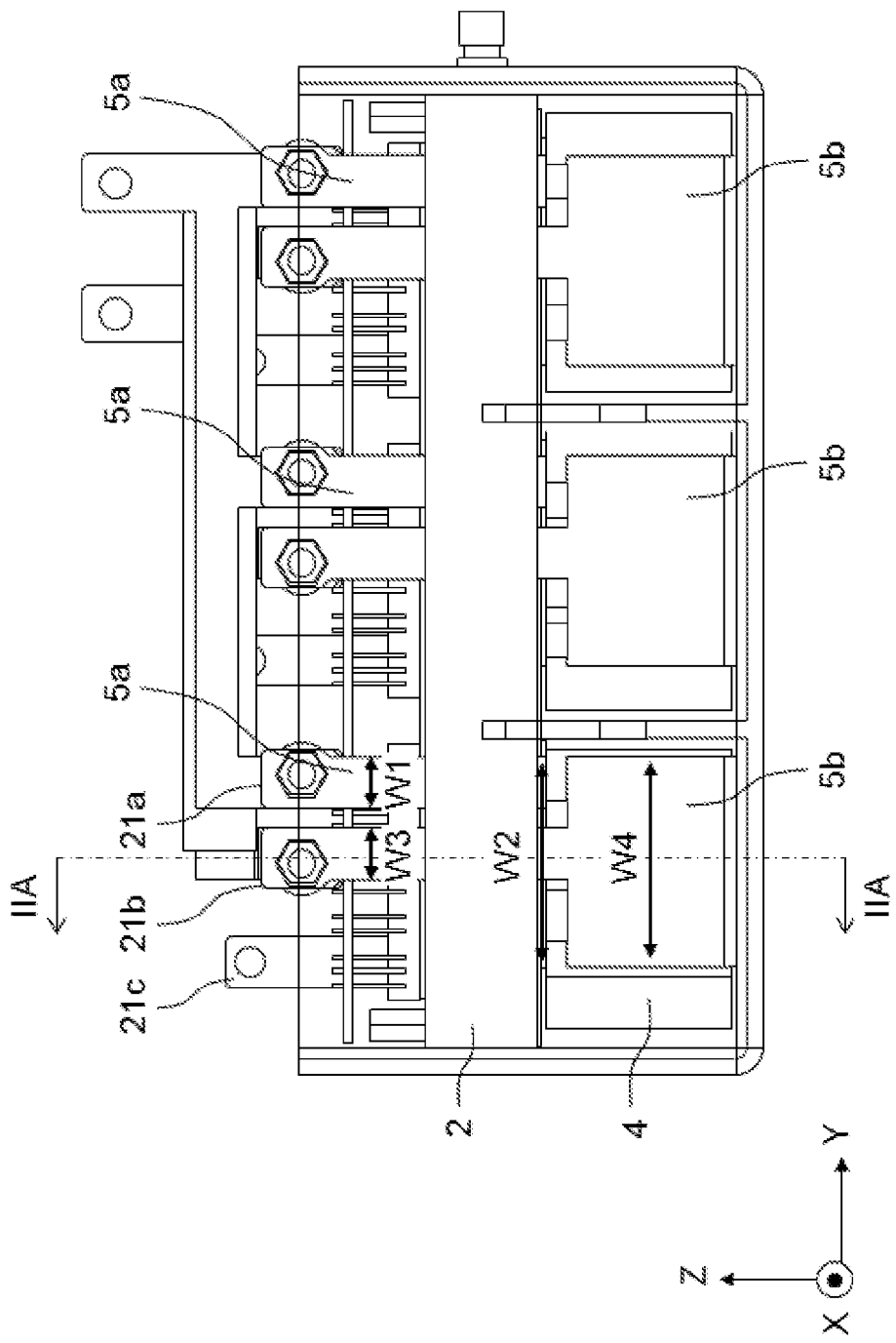
FIG. 1B is a schematic side view of the semiconductor device according to the first exemplary embodiment.
Figure 1C:
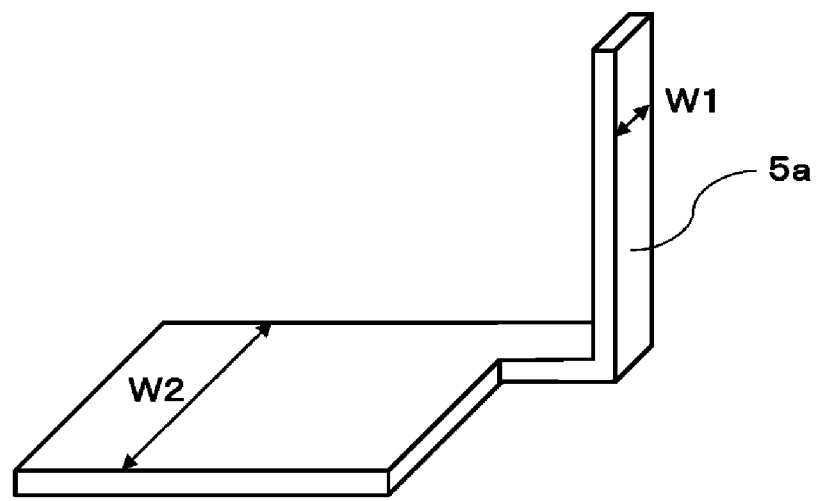
FIG. 1C is a schematic perspective view of a first bus bar of the semiconductor device according to the first exemplary embodiment.
Figure 1D:
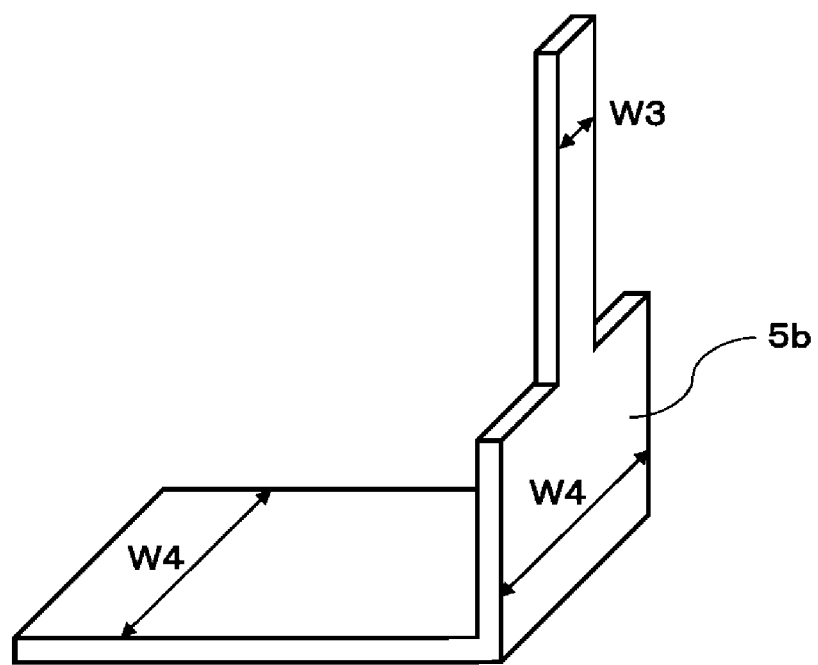
FIG. 1D is a schematic perspective view of a second bus bar of the semiconductor device according to the first exemplary embodiment.
Figure 2A:
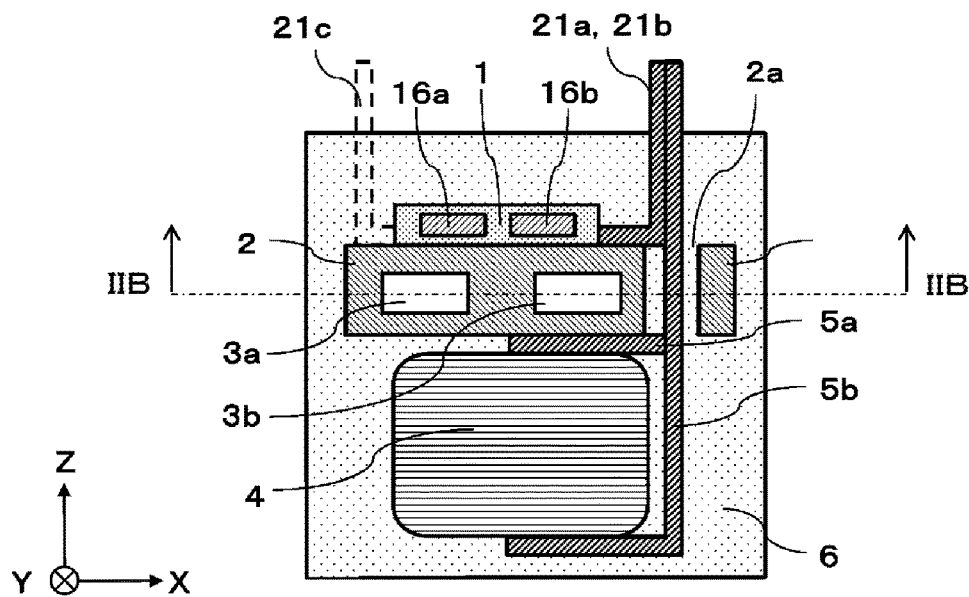
FIG. 2A is a schematic cross-sectional view of the semiconductor device according to the first exemplary embodiment, along a line IIA-IIA in FIG. 1B.
Figure 2B:
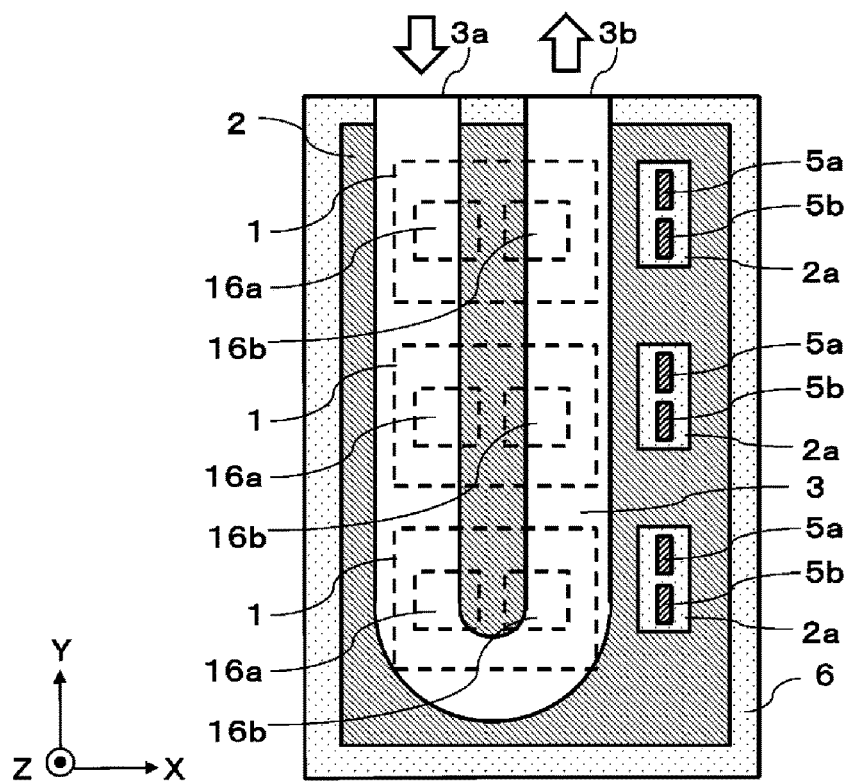
FIG. 2B is a schematic cross-sectional view of the semiconductor device according to the first exemplary embodiment, along a line IIB-IIB in FIG. 2A.
Figure 3:
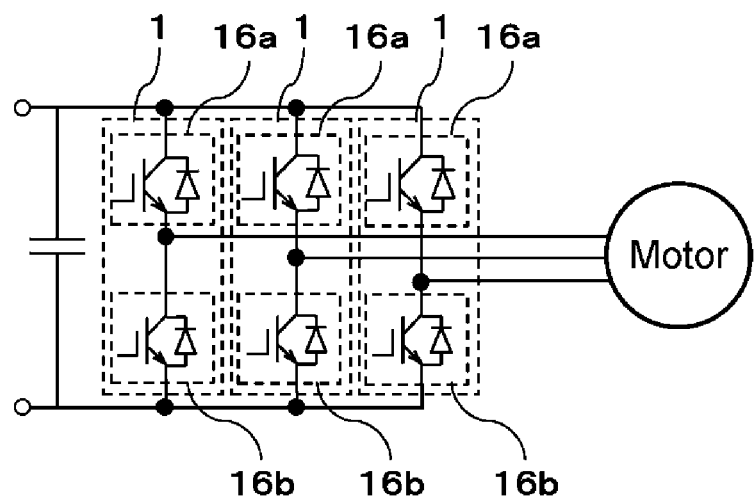
FIG. 3 is a diagram showing a circuit of the semiconductor device according to the first exemplary embodiment.
Figure 4:
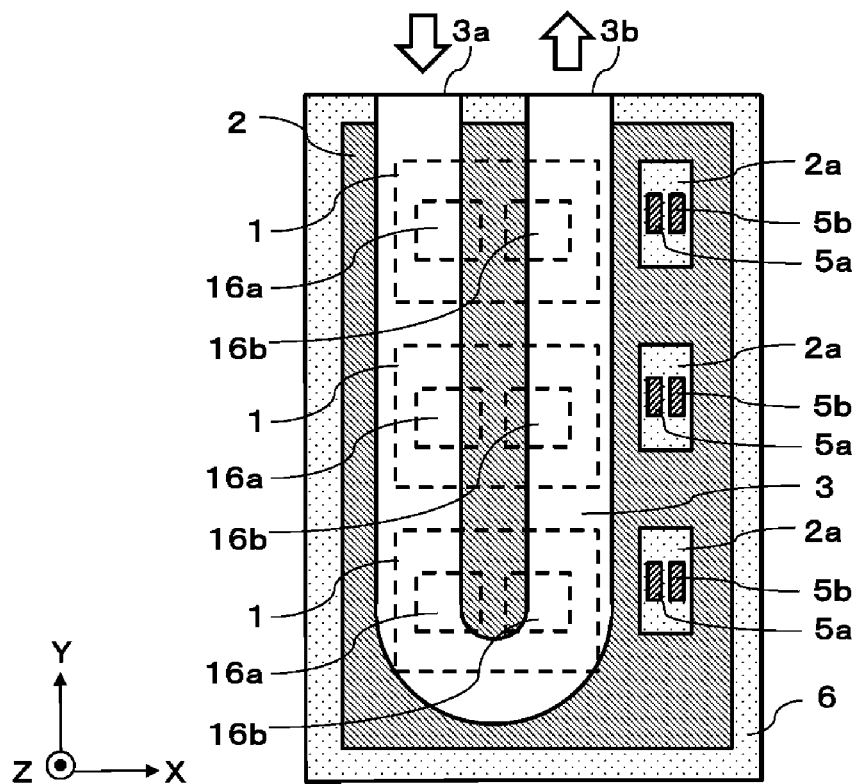
FIG. 4 is a schematic cross-sectional view of the semiconductor device according to the first exemplary embodiment where arrangement of bus bars is changed, the schematic cross-sectional view showing a position corresponding to the line IIB-IIB in FIG. 2A.

FIG. 1A is a schematic perspective view of the semiconductor device according to the first exemplary embodiment, and FIG. 1B is a schematic side view of the semiconductor device according to the first exemplary embodiment. To facilitate description, package 6 is shown in a manner allowing the structure inside to be seen. Also, coordinate axes are indicated in each drawing. Here, the direction from the bottom to the top of the drawing in FIG. 1A is given as a Z-direction, a longitudinal direction, of the semiconductor device, which is perpendicular to the Z-direction is given as a Y-direction, and the width direction is given as an X-direction. FIG. 1C is a schematic perspective view of a first bus bar of the semiconductor device according to the first exemplary embodiment, and FIG. 1D is a schematic perspective view of a second bus bar of the semiconductor device according to the first exemplary embodiment. FIG. 2A is a schematic cross-sectional view of the semiconductor device according to the first exemplary embodiment, along a line IIA-IIA in FIG. 1B, and FIG. 2B is a schematic cross-sectional view of the semiconductor device according to the first exemplary embodiment, along a line IIB-IIB in FIG. 2A. In FIG. 2B, to facilitate description, positions of semiconductor modules 1 and semiconductor elements 16a, 16b are shown by dotted lines. FIG. 3 is a diagram showing a circuit of the semiconductor device according to the first exemplary embodiment. FIG. 4 is a schematic cross-sectional view of the semiconductor device according to the first exemplary embodiment where arrangement of bus bars is changed, the schematic cross-sectional view showing a position corresponding to the line IIB-IIB in FIG. 2A As shown in FIGS. 1A and 1B, the semiconductor device of the present exemplary embodiment has three semiconductor modules 1 and three capacitors 4 for temporarily storing power from a battery disposed next to one another in the Y-direction. Cooling member 2 is disposed between semiconductor modules 1 and capacitors 4, and cooling member 2 includes channel 3 inside. Semiconductor module 1 includes semiconductor elements 16a, 16b (not shown) inside, and since heat is generated at the time of driving of a motor and the like, harmful effect is imposed on peripheral electronic components by the heat. Accordingly, with the semiconductor device of the present exemplary embodiment, cooling member 2 is provided between semiconductor modules 1 and capacitors 4 so that heat from semiconductor modules 1 is absorbed by cooling member 2, and capacitors 4 are prevented from being at a high temperature. Additionally, semiconductor modules 1, capacitors 4, and cooling member 2 are covered by package 6. Package 6 is formed from a sealing resin for sealing semiconductor modules 1, capacitors 4, cooling member 2 and the like, and a case enclosing the sealing resin. As the sealing resin, an epoxy resin, a silicone resin or the like is used, and as the case, one that is obtained by molding a polyphenylenesulfide (PPS) resin or a polybutyleneterephthalate (PBT) resin is used. Additionally, package 6 may be configured by using only the sealing resin and without using the case, or package 6 may be configured with the case formed of a metal material such as aluminum (Al).

Semiconductor module 1 constitutes an inverter circuit for driving a motor, shown in FIG. 3, and includes semiconductor elements 16a, 16b configured from a transistor, such as an IGBT element, and a diode. A connection with a wiring to the motor is disposed between semiconductor element 16a and semiconductor element 16b. Semiconductor element 16b is connected on a negative electrode side of the connection, and semiconductor element 16a is connected on a positive electrode side of the connection. The negative electrode side is referred to as a low side, and the positive electrode side is referred to as a high side. High-side semiconductor element 16a and low-side semiconductor element 16b are paired up. When the motor is driven, power is supplied from high-side semiconductor element 16a, and thus a greater amount of heat is generated by high-side semiconductor element 16a compared with low-side semiconductor element 16b. Therefore, the temperature of high-side semiconductor element 16a becomes higher. As shown in FIG. 1A, three power terminals, namely, power terminal (P terminal) 21a to be connected to high-side semiconductor element 16a, power terminal (N terminal) 21b to be connected to low-side semiconductor element 16b, and power terminal 21c to be connected to the motor, extend from each semiconductor module 1.

As shown in FIGS. 1A and 2A, semiconductor module 1 and capacitor 4 are electrically connected by first bus bar 5a and second bus bar 5b formed by strip-shaped conductive members. First bus bar 5a is connected to P terminal 21a connected to high-side semiconductor element 16a. And second bus bar 5b is connected to N terminal 21b connected to low-side semiconductor element 16b. Also, capacitor 4 includes electrodes on an upper surface and a lower surface, respectively. The electrode on the upper surface of capacitor 4 is connected to first bus bar 5a, and the electrode on the lower surface of capacitor 4 is connected to second bus bar 5b. Here, first bus bar 5a and second bus bar 5b are collectively referred to as bus bars.

Moreover, first bus bar 5a and second bus bar 5b extend through through hole 2a of cooling member 2, and connect capacitor 4 and semiconductor module 1. That is, inside through hole 2a, first bus bar 5a and second bus bar 5b are surrounded by cooling member 2, and first bus bar 5a and second bus bar 5b face cooling member 2 on all of four side aspects. The amount of heat dissipation from the bas bars to cooling member 2 may thus be increased.

As shown in FIGS. 1A and 2A, first bus bar 5a is disposed between cooling member 2 and capacitor 4, and is bent at a right angle near an edge of the upper surface of capacitor 4. First bus bar 5a extends upward to pass through through hole 2a of cooling member 2, and is then connected to P terminal 21a of semiconductor module 1. Also, as shown in FIG. 1C, first bus bar 5a has a part with a width of W1, and a part with a width of W2, which is greater than W1. As shown in FIG. 1B, first bus bar 5a has the width of W1 at a part connected to P terminal 21a of semiconductor module 1 and inside through hole 2a of cooling member 2. And first bus bar 5a has the width of W2, which is greater than W1, between cooling member 2 and capacitor 4. Accordingly, an area of first bus bar 5a facing cooling member 2 is increased, and the amount of heat dissipation from first bus bar 5a to cooling member 2 may be increased.

Furthermore, as shown in FIGS. 1A and 2A, second bus bar 5b is bent at a right angle near an edge of the lower surface of capacitor 4. Second bus bar 5b extends upward to pass through through hole 2a of cooling member 2, and is then connected to N terminal 21b of semiconductor module 1. Also, as shown in FIG. 1D, second bus bar 5b has a part with a width of W3, and a part with a width of W4, which is greater than W3. As shown in FIG. 1B, second bus bar 5b has the width of W3 at a part connected to N terminal 21b of semiconductor module 1 and inside through hole 2a of cooling member 2. And second bus bar 5b has the width of W4, which is greater than W3, from a bent portion near the lower surface of capacitor 4 to through hole 2a of cooling member 2. That is, second bus bar 5b has a third width (W3) and a fourth width (W4), which is greater than the third width (W3) between semiconductor module 1 and capacitor 4. Accordingly, a heat dissipation area is increased at a part, of second bus bar 5b, with a wide width, and the amount of heat dissipation from second bus bar 5b to package 6 and the like may be increased.

Here, first bus bar 5a according to the present exemplary embodiment is an example of a "first conductive member" of the present application, and second bus bar 5b is an example of a "second conductive member" of the present application. Also, W1 according to the present exemplary embodiment is an example of a "first width" of the present application, and W2 is an example of a "second width" of the present application.

Next, an internal structure of the semiconductor device of the present exemplary embodiment will be described in detail with reference to FIGS. 2A and 2B. As shown in FIGS. 2A and 2B, semiconductor module 1 includes inside high-side semiconductor element 16a and low-side semiconductor element 16b. P terminal 21a and N terminal 21b for power, extending from semiconductor module 1, are connected to first bus bar 5a and second bus bar 5b, respectively.

First bus bar 5a is disposed between capacitor 4 and cooling member 2, and is connected to the electrode on the upper surface of capacitor 4. Also, first bus bar 5a is bent at a right angle at a position separate from the electrode on the upper surface of capacitor 4. And first bus bar 5a passes through through hole 2a of cooling member 2, and is connected to P terminal 21a extending from semiconductor module 1. Also, second bus bar 5b is connected to the electrode on the lower surface of capacitor 4, and is bent at a right angle at a position separate from the electrode on the lower surface of capacitor 4. And second bus bar 5b passes through through hole 2a of cooling member 2, and is connected to N terminal 21b extending from semiconductor module 1.

Moreover, channel 3 allowing a cooling medium, such as water, ethylene glycol or a refrigerant gas, to flow is formed to cooling member 2. Channel 3 is curved inside cooling member 2, and includes flow inlet 3a and flow outlet 3b on a same side surface of cooling member 2. Here, semiconductor module 1 is disposed on an upper surface of cooling member 2 so as to be positioned above channel 3. The amount of heat dissipation from semiconductor module 1 to channel 3 may thereby be increased. Also, high-side semiconductor element 16a is disposed above channel 3, on a side nearer to flow inlet 3a. A cooling medium flowing through channel 3 absorbs heat and has its temperature increased while flowing from flow inlet 3a to flow outlet 3b. Accordingly, a cooling medium nearer to flow inlet 3a has a lower temperature, and may absorb a greater amount of heat. As described above, since high-side semiconductor element 16a generates more heat, an increase in the temperature of semiconductor module 1 may be suppressed by disposing high-side semiconductor element 16a above channel 3, on the side nearer to flow inlet 3a.

As described above, first bus bar 5a and second bus bar 5b pass through through hole 2a of cooling member 2, and connect semiconductor module 1 and capacitor 4. With the bus bars configured to pass near cooling member 2, heat dissipation from the bus bars to cooling member 2 may be promoted, and heat transferred from semiconductor module 1 to capacitor 4 may be reduced by the bus bars.

As shown in FIG. 2B, cross sections of first bus bar 5a and second bus bar 5b each have a rectangular shape, and have a first side surface corresponding to a long side of the rectangle and a second side surface corresponding to a short side of the rectangle. Since the first side surfaces have larger areas, first bus bar 5a and second bus bar 5b are disposed with the first side surfaces facing the part, of cooling member 2, where channel 3 is provided. Accordingly, compared to a case where the second side surfaces with smaller areas face the part, of cooling member 2, where channel 3 is provided, the amount of heat dissipation from first bus bar 5a and second bus bar 5b to cooling member 2 is increased. Here, first bus bar 5a and second bus bar 5b are disposed next to each other, along a direction parallel to a direction of channel 3. When disposed in this manner, first bus bar 5a and second bus bar 5b may face the part, of cooling member 2, where channel 3 is provided, with nothing between the bus bars and cooling member 2, and thus a greater amount of heat may be dissipated to cooling member 2.

On the other hand, as shown in FIG. 4, first bus bar 5a and second bus bar 5b may be disposed with the first side surfaces overlapping each other. When disposed in this manner, the cooling effect may be reduced but an increase in inductance may be suppressed compared to the case where first bus bar 5a and second bus bar 5b are disposed next to each other, along the direction parallel to the direction of channel 3. Mutual inductance of adjacent current paths is given by Lenz's law, and inductance is cancelled by first bus bar 5a and second bus bar 5b whose currents are in opposite directions. In the present exemplary embodiment, since the first side surfaces, which are the larger side surfaces, of first bus bar 5a and second bus bar 5b face each other, greater inductance is cancelled. Thus, an increase in the inductance of the entire semiconductor device may be suppressed.

As described above, by causing first bus bar 5a and second bus bar 5b to pass through through hole 2a of cooling member 2, transfer of heat from semiconductor module 1 to capacitor 4 may be suppressed. Thus, an increase in the temperature of capacitor 4 may be suppressed. In addition, by providing a wide part to first bus bar 5a, which is connected to high-side semiconductor element 16a generating a great amount of heat, and disposing the wide part between cooling member 2 and capacitor 4, the amount of heat dissipation to cooling member 2 may be increased. Also, by providing a wide part to second bus bar 5b not disposed between cooling member 2 and capacitor 4, the amount of heat dissipation from second bus bar 5b to package 6 and the like may be increased because a heat dissipation area may be increased. Accordingly, an increase in the temperature of capacitor 4 may be further suppressed.

Additionally, a film capacitor with a high insulation property may be used as capacitor 4 of the present exemplary embodiment. A film capacitor has a structure where metal foils as a cathode and an anode are formed and wound around a plastic film or the like.

Here, capacitor 4 according to the present exemplary embodiment is an example of a "passive element" of the present application. Additionally, other than capacitor 4, the "passive element" of the present application includes a reactor and the like.

As described above, the semiconductor device according to the present exemplary embodiment may increase the amount of heat dissipation from first bus bar 5a and second bus bar 5b by causing first bus bar 5a and second bus bar 5b to pass through through hole 2a of cooling member 2, disposing first bus bar 5a between cooling member 2 and capacitor 4, and providing a wide part to second bus bar 5b. Accordingly, transfer of heat from semiconductor module 1 to capacitor 4 may be suppressed, and an increase in the temperature of capacitor 4 due to heat generation by semiconductor module 1 may be suppressed.

Second Exemplary Embodiment

Figure 5A:
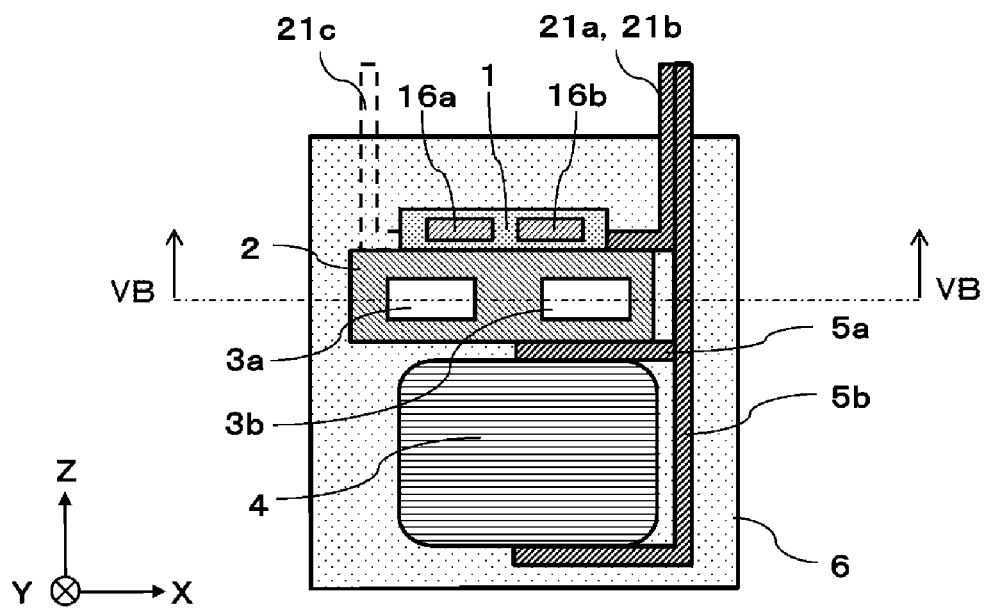
FIG. 5A is a schematic cross-sectional view of a semiconductor device according to a second exemplary embodiment, at a position corresponding to the line IIA-IIA in FIG. 1B.
Figure 5B:
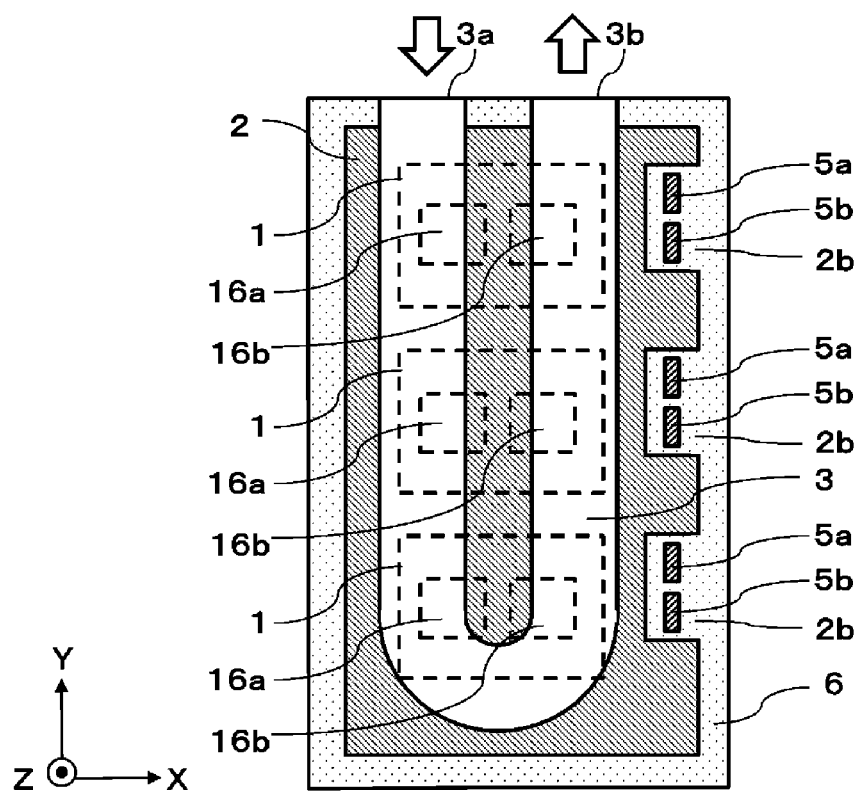
FIG. 5B is a schematic cross-sectional view of the semiconductor device according to the second exemplary embodiment, along a line VB-VB in FIG. 5A.

A configuration of a semiconductor device according to a second exemplary embodiment will be described with reference to FIGS. 5A and 5B. FIG. 5A is a schematic cross-sectional view of the semiconductor device according to the second exemplary embodiment, at a position corresponding to the line IIA-IIA in FIG. 1B, and FIG. 5B is a schematic cross-sectional view of the semiconductor device according to the second exemplary embodiment, along a line VB-VB in FIG. 5A. As shown in FIGS. 5A and 5B, according to the semiconductor device of the second exemplary embodiment, first bus bars 5a and second bus bars 5b extend through cut-out portions 2b provided to cooling member 2. Other configurations are the same as those in the first exemplary embodiment.

According to the present exemplary embodiment, first bus bar 5a and second bus bar 5b face cooling member 2 at three side aspects other than an opening direction of cut-out portion 2b. Accordingly, the amount of heat dissipation from the bus bars may be increased. Also, compared to a case where through holes 2a are formed to cooling member 2, the width of cooling member 2 may be reduced, and the semiconductor device may be miniaturized.

Third Exemplary Embodiment

Figure 6A:
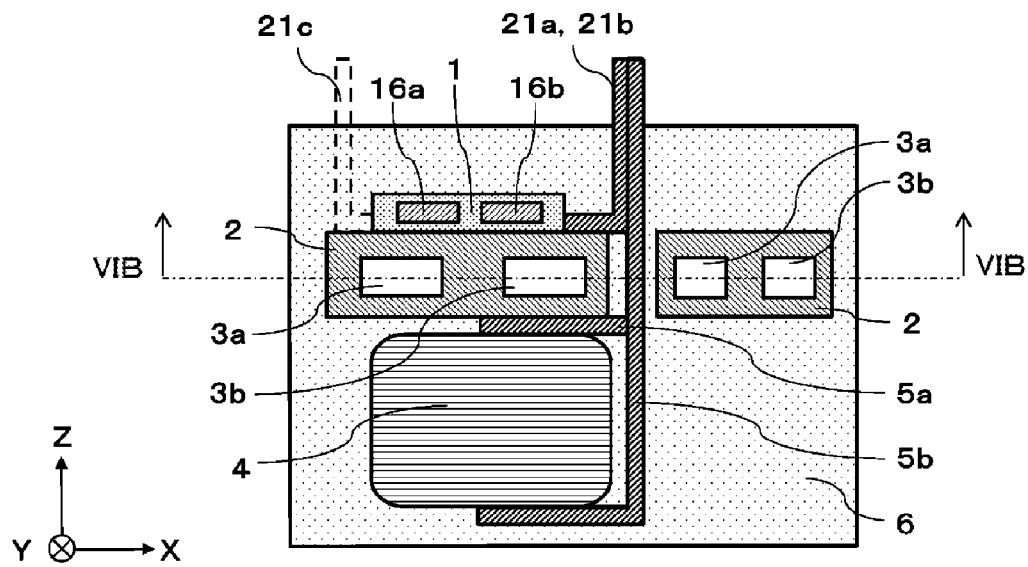
FIG. 6A is a schematic cross-sectional view of a semiconductor device according to a third exemplary embodiment, at a position corresponding to the line IIA-IIA in FIG. 1B.
Figure 6B:
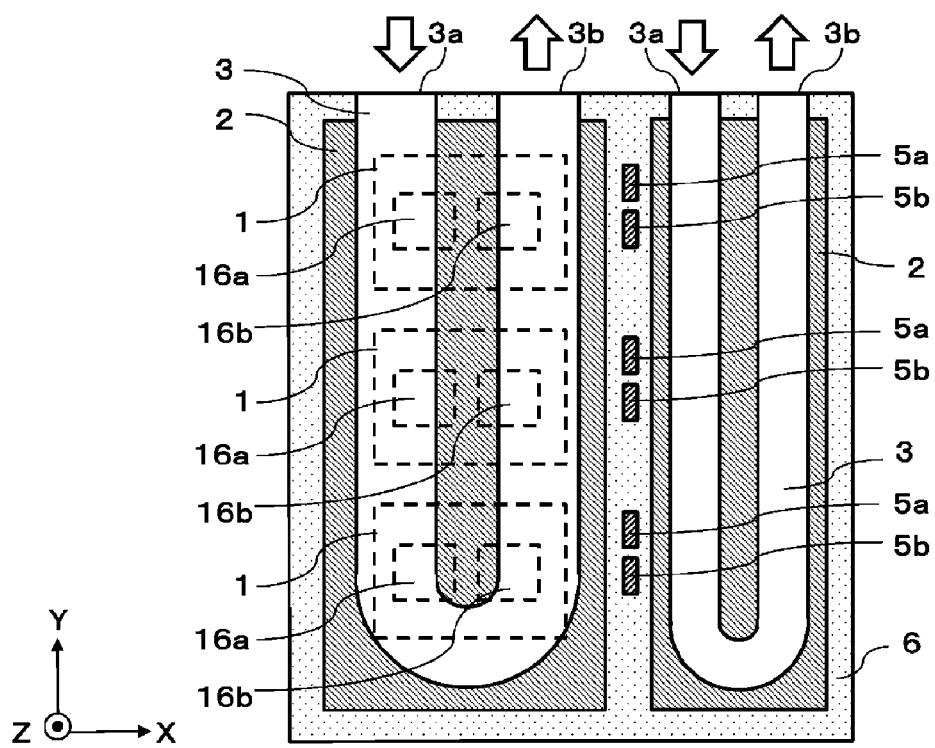
FIG. 6B is a schematic cross-sectional view of the semiconductor device according to the third exemplary embodiment, along a line VIB-VIB in FIG. 6A.

A configuration of a semiconductor device according to a third exemplary embodiment will be described with reference to FIGS. 6A and 6B. FIG. 6A is a schematic cross-sectional view of the semiconductor device according to the third exemplary embodiment, at a position corresponding to the line IIA-IIA in FIG. 1B, and FIG. 6B is a schematic cross-sectional view of the semiconductor device according to the third exemplary embodiment, along a line VIB-VIB in FIG. 6A. As shown in FIGS. 6A and 6B, according to the semiconductor device of the third exemplary embodiment, through holes 2a are not formed to cooling member 2, and first bus bars 5a and second bus bars 5b do not pass through through holes 2a of cooling member 2. Moreover, another cooling member 2 is provided adjacent to first bus bars 5a and second bus bars 5b, and first bus bars 5a and second bus bars 5b are disposed such that first bus bars 5a and second bus bars 5b are interposed between two cooling members 2. Other configurations are the same as those in the first exemplary embodiment.

According to the present exemplary embodiment, first bus bars 5a and second bus bars 5b face both of two cooling members 2 disposed on both sides, at the first side surfaces with large areas. That is, first bus bars 5a and second bus bars 5b each face cooling members 2 at two side surfaces. Accordingly, the amount of heat dissipation from the bus bars to cooling members 2 may be increased, as in a case where the bus bars are disposed inside through holes 2a of cooling member 2. Moreover, cooling members 2 on both sides of the bus bars include channel 3 for allowing a cooling medium to flow. Accordingly, cooling members 2 on both sides of the bus bars may be maintained at a low temperature, and the amount of heat dissipation from the bus bars to cooling member 2 may be increased. An increase in the temperature of capacitor 4 may thereby be suppressed.

Fourth Exemplary Embodiment

Figure 7A:
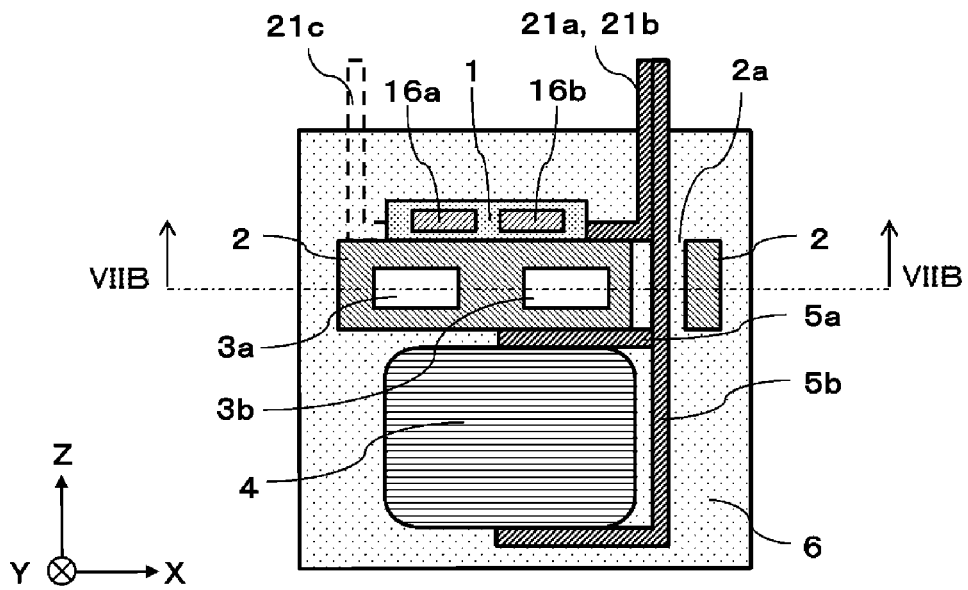
FIG. 7A is a schematic cross-sectional view of a semiconductor device according to a fourth exemplary embodiment, at a position corresponding to the line IIA-IIA in FIG. 1B.
Figure 7B:
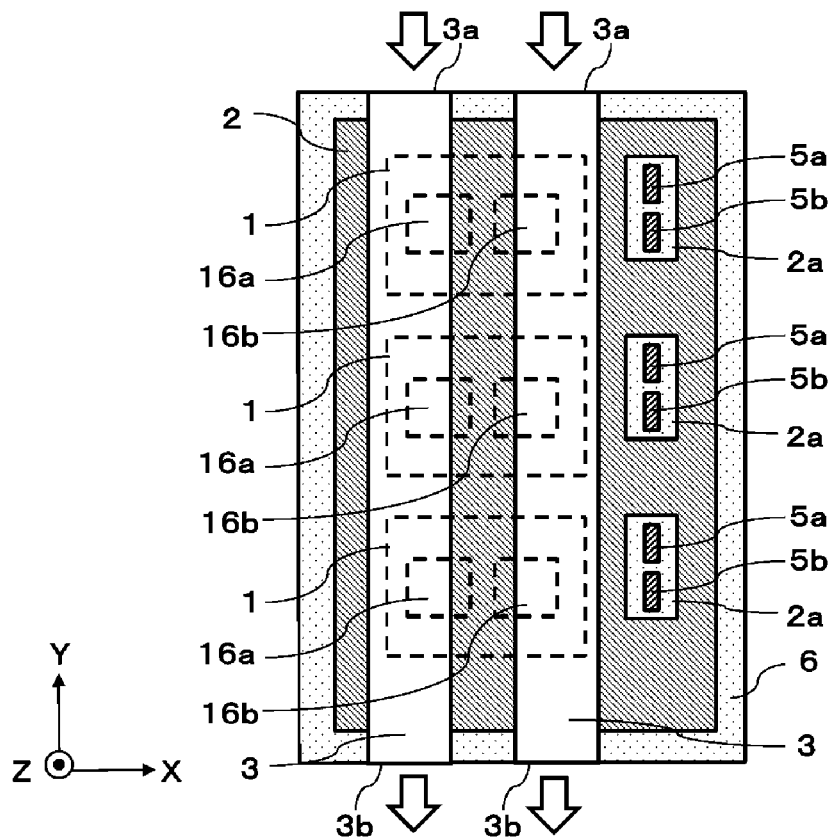
FIG. 7B is a schematic cross-sectional view of the semiconductor device according to the fourth exemplary embodiment, along a line VIIB-VIIB in FIG. 7A.

A configuration of a semiconductor device according to a fourth exemplary embodiment will be described with reference to FIGS. 7A and 7B. FIG. 7A is a schematic cross-sectional view of the semiconductor device according to the fourth exemplary embodiment, at a position corresponding to the line IIA-IIA in FIG. 1B, and FIG. 7B is a schematic cross-sectional view of the semiconductor device according to the fourth exemplary embodiment, along a line VIIB-VIIB in FIG. 7A. As shown in FIGS. 7A and 7B, according to the semiconductor device of the fourth exemplary embodiment, channels 3 inside cooling member 2 are not curved inside cooling member 2, and include flow inlets 3a at one side surface of cooling member 2, and flow outlets 3b at an opposite side surface. That is, a cooling medium flows in one direction through the inside of cooling member 2, and does not return to the side surface where flow inlets 3a are present. Also, one each of channels 3 is provided below high-side semiconductor element 16a inside semiconductor module 1, and another each of channels 3 is provided below low-side semiconductor element 16b inside semiconductor module 1. Other configurations are the same as those in the first exemplary embodiment.

According to the present exemplary embodiment, since a plurality of channels 3 are formed to cooling member 2, the cooling capacity is high. Thus, the amount of heat dissipation from semiconductor modules 1, the bus bars, and capacitors 4 may be increased. Moreover, since channel 3 is provided below each of high-side semiconductor elements 16a and low-side semiconductor elements 16b inside semiconductor modules 1, the temperature of a cooling medium flowing below low-side semiconductor element 16b may be reduced. Consequently, the amount of heat dissipation from semiconductor modules 1 may be increased.

Fifth Exemplary Embodiment

Figure 8A:
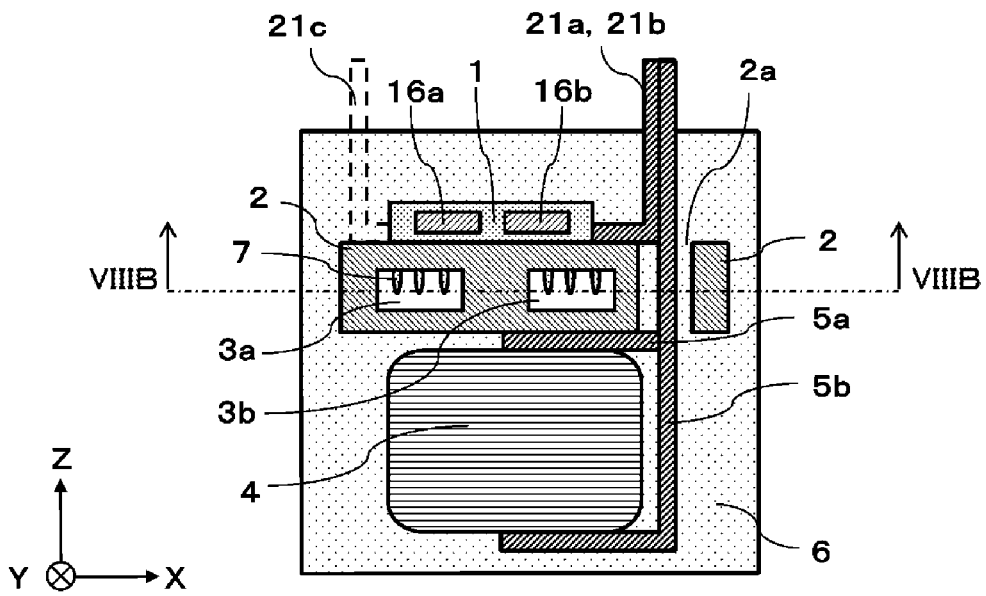
FIG. 8A is a schematic cross-sectional view of a semiconductor device according to a fifth exemplary embodiment, at a position corresponding to the line IIA-IIA in FIG. 1B.
Figure 8B:
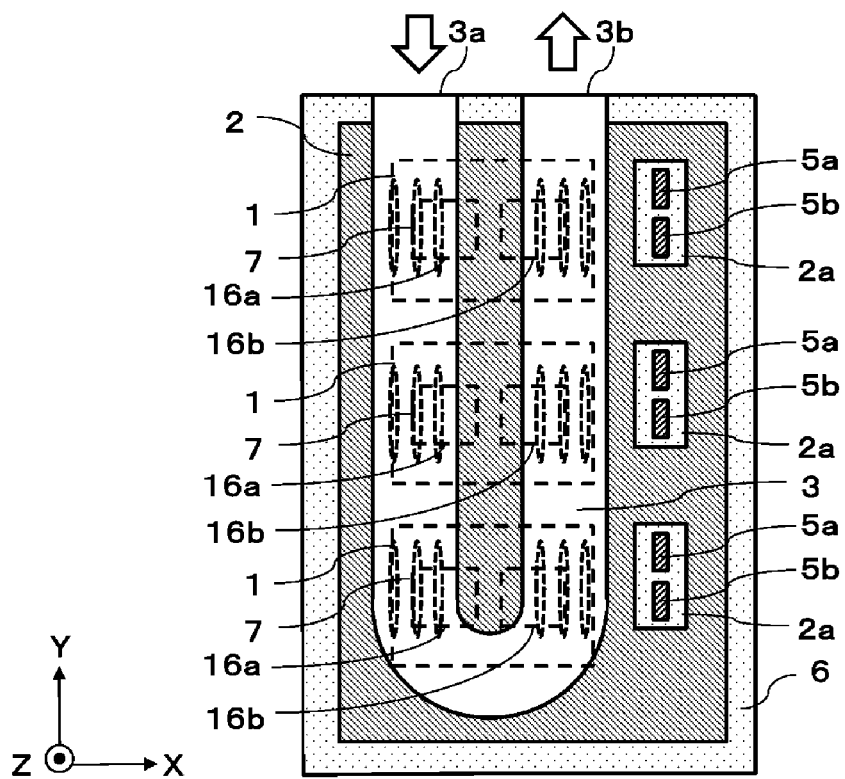
FIG. 8B is a schematic cross-sectional view of the semiconductor device according to the fifth exemplary embodiment, along a line VIIIB-VIIIB in FIG. 8A.

A configuration of a semiconductor device according to a fifth exemplary embodiment will be described with reference to FIGS. 8A and 8B. FIG. 8A is a schematic cross-sectional view of the semiconductor device according to the fifth exemplary embodiment, at a position corresponding to the line IIA-IIA in FIG. 1B, and FIG. 8B is a schematic cross-sectional view of the semiconductor device according to the fifth exemplary embodiment, along a line VIIIB-VIIIB in FIG. 8A. As shown in FIGS. 8A and 8B, according to the semiconductor device of the fifth exemplary embodiment, fins 7 for increasing a heat dissipation area are provided inside channel 3 of cooling member 2. Fins 7 are provided below semiconductor modules 1. Other configurations are the same as those in the first exemplary embodiment.

According to the present exemplary embodiment, the amount of heat dissipation from cooling member 2 to a cooling medium is increased by fins 7. Furthermore, because fins 7 are provided below semiconductor modules 1, heat dissipation particularly from semiconductor modules 1 may be promoted.

Sixth Exemplary Embodiment

Figure 9A:
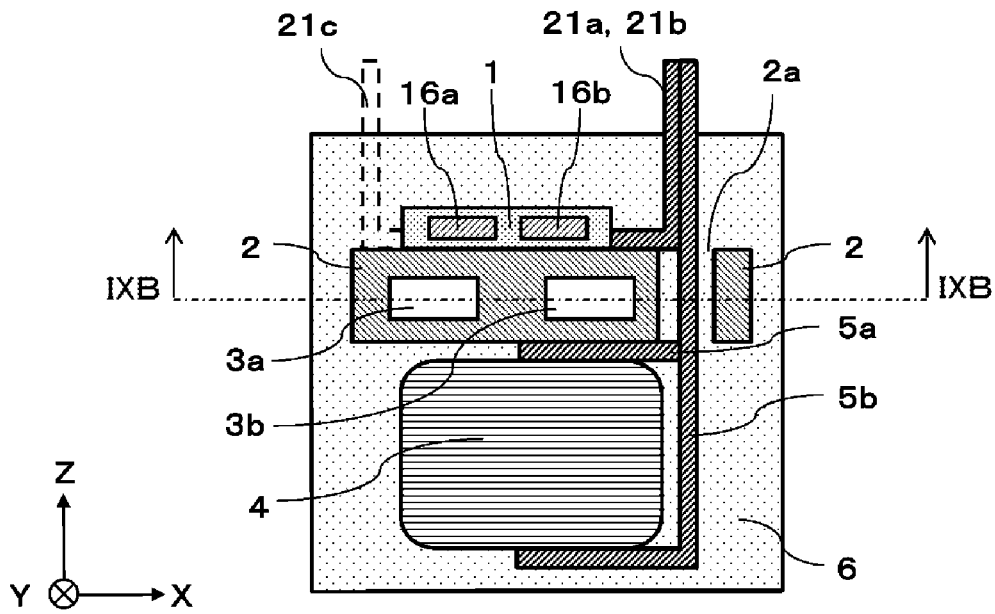
FIG. 9A is a schematic cross-sectional view of a semiconductor device according to a sixth exemplary embodiment, at a position corresponding to the line IIA-IIA in FIG. 1B.
Figure 9B:
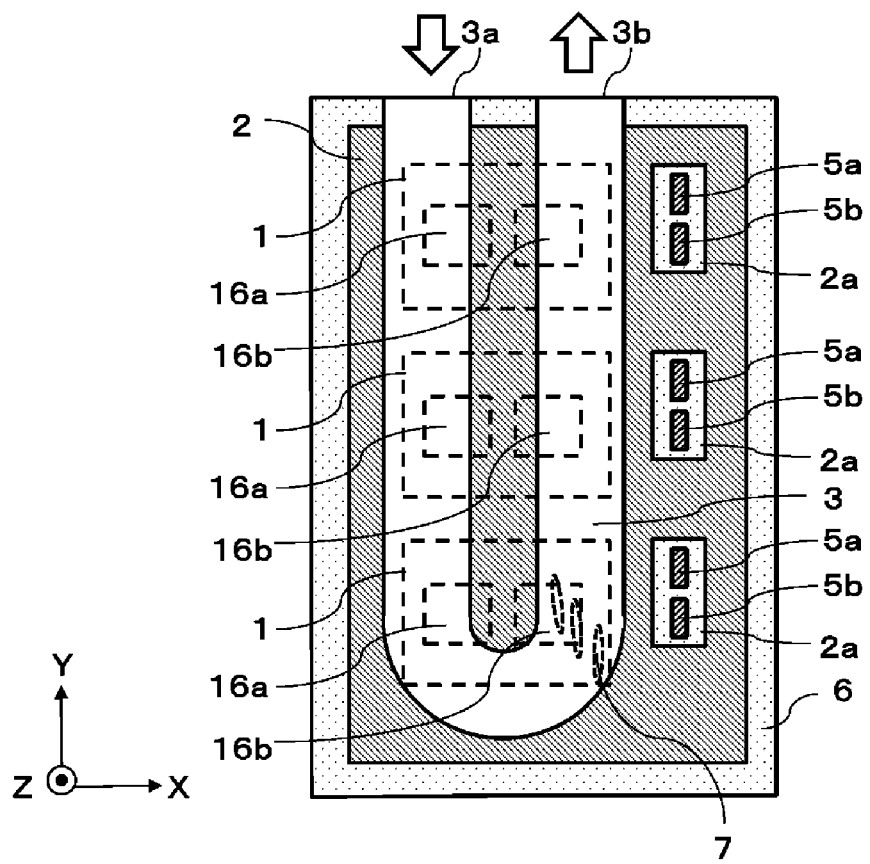
FIG. 9B is a schematic cross-sectional view of the semiconductor device according to the sixth exemplary embodiment, along a line IXB-IXB in FIG. 9A.

A configuration of a semiconductor device according to a sixth exemplary embodiment will be described with reference to FIGS. 9A and 9B. FIG. 9A is a schematic cross-sectional view of the semiconductor device according to the sixth exemplary embodiment, at a position corresponding to the line IIA-IIA in FIG. 1B, and FIG. 9B is a schematic cross-sectional view of the semiconductor device according to the sixth exemplary embodiment, along a line IXB-IXB in FIG. 9A. As shown in FIGS. 9A and 9B, according to the semiconductor device of the sixth exemplary embodiment, fins 7 are provided inside channel 3 of cooling member 2, near a curved portion of channel 3, so as to control a direction of flow of a cooling medium so that the flow of a cooling medium is directed toward a center side of the curve. Other configurations are the same as those in the first exemplary embodiment.

When a cooling medium flows through the curved portion inside channel 3 of cooling member 2, the water pressure is reduced on the inside of the curve by a centrifugal force, and bubbles are generated. When bubbles are generated, transfer of heat from cooling member 2 to the cooling medium is suppressed, and thus the heat dissipation effect is reduced.

According to the present exemplary embodiment, because the flow of the cooling medium may be directed toward the center side of the curve by fins 7, bubbles may be suppressed at the time of the cooling medium flowing through the curved portion. Accordingly, reduction in the amount of heat dissipation from cooling member 2 to the cooling medium may be suppressed.

Seventh Exemplary Embodiment

Figure 10:
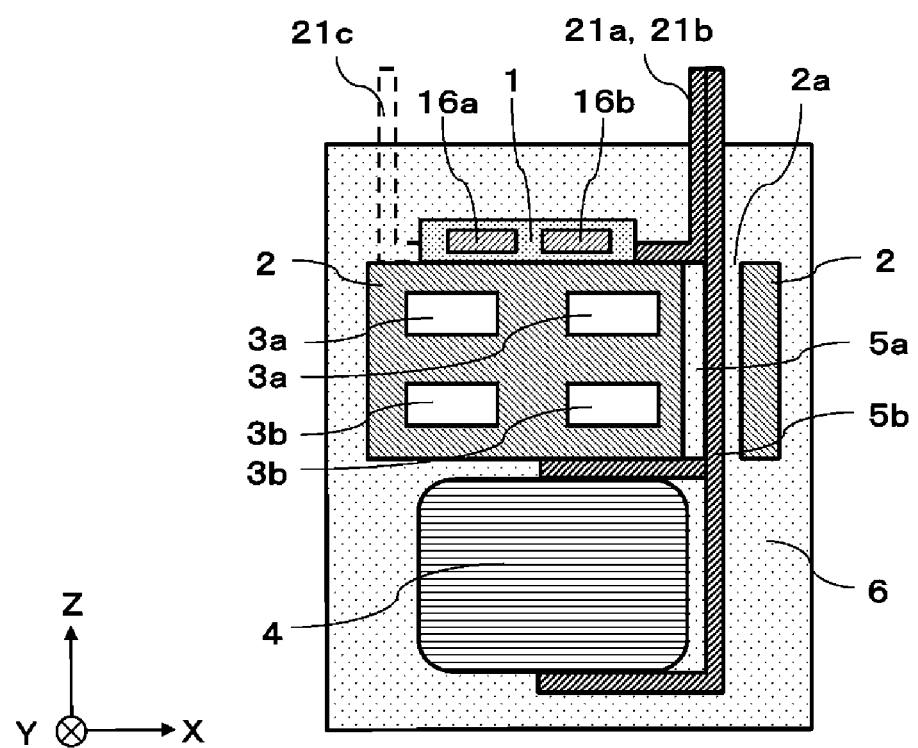
FIG. 10 is a schematic cross-sectional view of a semiconductor device according to a seventh exemplary embodiment, at a position corresponding to the line IIA-IIA in FIG. 1B.

A configuration of a semiconductor device according to a seventh exemplary embodiment will be described with reference to FIG. 10. FIG. 10 is a schematic cross-sectional view of the semiconductor device according to the seventh exemplary embodiment, at a position corresponding to the line IIA-IIA in FIG. 1B. As shown in FIG. 10, according to the semiconductor device of the seventh exemplary embodiment, two channels 3 (not shown) are provided inside cooling member 2, and flow inlet 3a and flow outlet 3b of each channel are disposed next to each other in the Z-direction. That is, according to the semiconductor device of the seventh exemplary embodiment, unlike in the first exemplary embodiment, channels 3 provided to cooling member 2 are curved in a vertical direction (on a Y-Z plane). A cooling medium flows from flow inlet 3a provided on a side surface of cooling member 2 into channel 3 on the upper surface (the surface where semiconductor module 1 is disposed) side of cooling member 2. And the cooling medium enters channel 3 on a lower surface side of cooling member 2 at the curved portion of channel 3, and then returns to flow outlet 3b provided on the same side surface of cooling member 2. Also, channel 3 is provided below each of high-side semiconductor element 16a and low-side semiconductor element 16b inside semiconductor module 1. Other configurations are the same as those in the first exemplary embodiment.

According to the present exemplary embodiment, because a plurality of channels 3 are formed to cooling member 2, the cooling capacity is high. Thus, the amount of heat dissipation from semiconductor modules 1, the bus bars, and capacitors 4 may be increased. Also, since channels 3 near flow inlets 3a are disposed on a side closer to the surface where semiconductor modules 1 are disposed, the amount of heat dissipation from semiconductor modules 1 may be increased.

Eighth Exemplary Embodiment

Figure 11A:
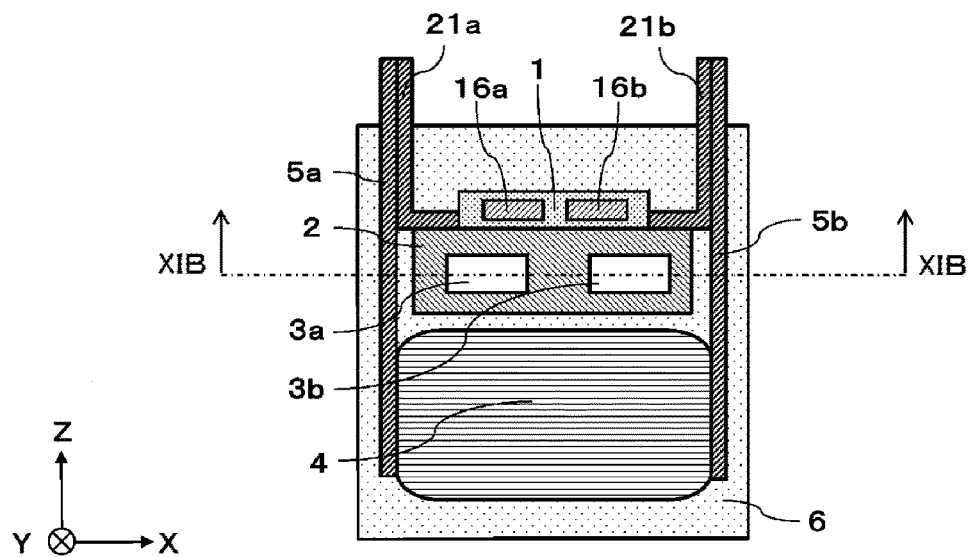
FIG. 11A is a schematic cross-sectional view of a semiconductor device according to an eighth exemplary embodiment, at a position corresponding to the line IIA-IIA in FIG. 1B.
Figure 11B:
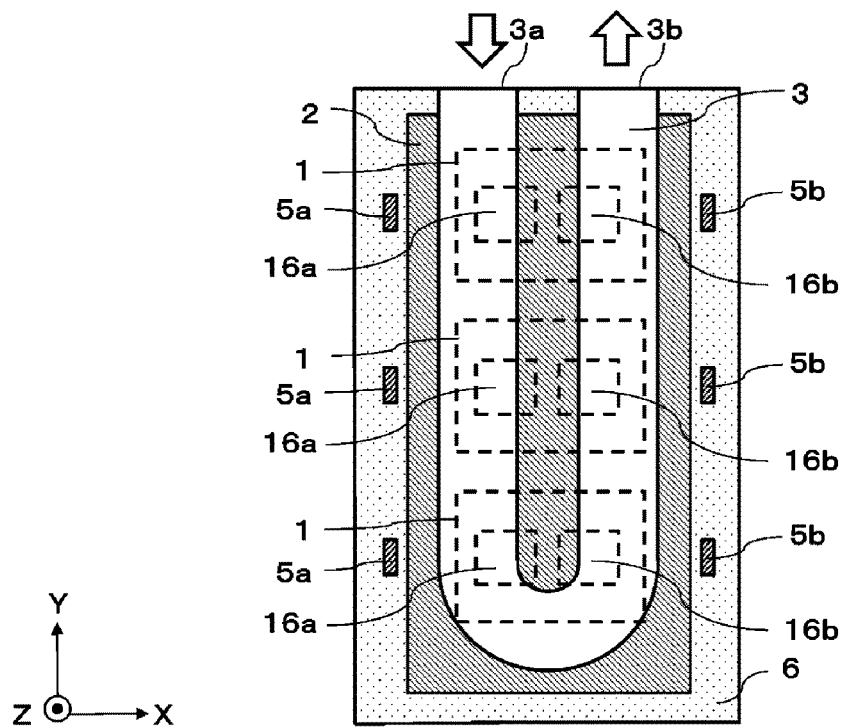
FIG. 11B is a schematic cross-sectional view of the semiconductor device according to the eighth exemplary embodiment, along a line XIB-XIB in FIG. 11A.

A configuration of a semiconductor device according to an eighth exemplary embodiment will be described with reference to FIGS. 11A and 11B. FIG. 11A is a schematic cross-sectional view of the semiconductor device according to the eighth exemplary embodiment, at a position corresponding to the line IIA-IIA in FIG. 1B, and FIG. 11B is a schematic cross-sectional view of the semiconductor device according to the eighth exemplary embodiment, along a line XIB-XIB in FIG. 11A. As shown in FIGS. 11A and 11B, according to the semiconductor device of the eighth exemplary embodiment, capacitors 4 are disposed with the electrodes of capacitors 4 positioned on both side surfaces. Also, first bus bars 5a and second bus bars 5b connected to respective electrodes of capacitors 4 are separated to respective sides of cooling member 2. And first bus bars 5a and second bus bars 5b connect capacitors 4 and semiconductor modules 1. That is, cooling member 2 and semiconductor modules 1 are disposed between first bus bars 5a and second bus bars 5b. Through holes 2a are not provided to cooling member 2. Other configurations are the same as those in the first exemplary embodiment.

According to the present exemplary embodiment, first bus bars 5a and second bus bars 5b connected to respective sides of capacitors 4 are connected to semiconductor modules 1 without passing through between capacitors 4 and cooling member 2. Accordingly, since lengths of bus bars between capacitors 4 and semiconductor modules 1 may be reduced, an increase in the inductance due to lengths of conductive members may be suppressed to the minimum. Also, since cooling member 2 is not disposed outside first bus bars 5a and second bus bars 5b, the semiconductor device may be miniaturized.

Also, according to the present exemplary embodiment, first bus bars 5a connected to high-side semiconductor elements 16a that generate a great amount of heat are disposed near channel 3 of cooling member 2, on the side of flow inlet 3a. That is, first bus bars 5a whose temperatures become high are placed near channel 3, on the side of flow inlet 3a where the temperature of the cooling medium is low, and first bus bars 5a are made to face cooling member 2. Accordingly, the amount of heat dissipation from the bus bars may be increased, and an increase in the temperature of capacitors 4 may be suppressed.

Additionally, in the present exemplary embodiment, first bus bars 5a and second bus bars 5b may include wide parts, as in the first exemplary embodiment, at arbitrary positions between capacitors 4 and semiconductor modules 1. Alternatively, first bus bars 5a and second bus bars 5b may have a wide width in entire portion between capacitors 4 and semiconductor modules 1. The amount of heat dissipation from the bus bars may thereby be increased.

Ninth Exemplary Embodiment

Figure 12A:
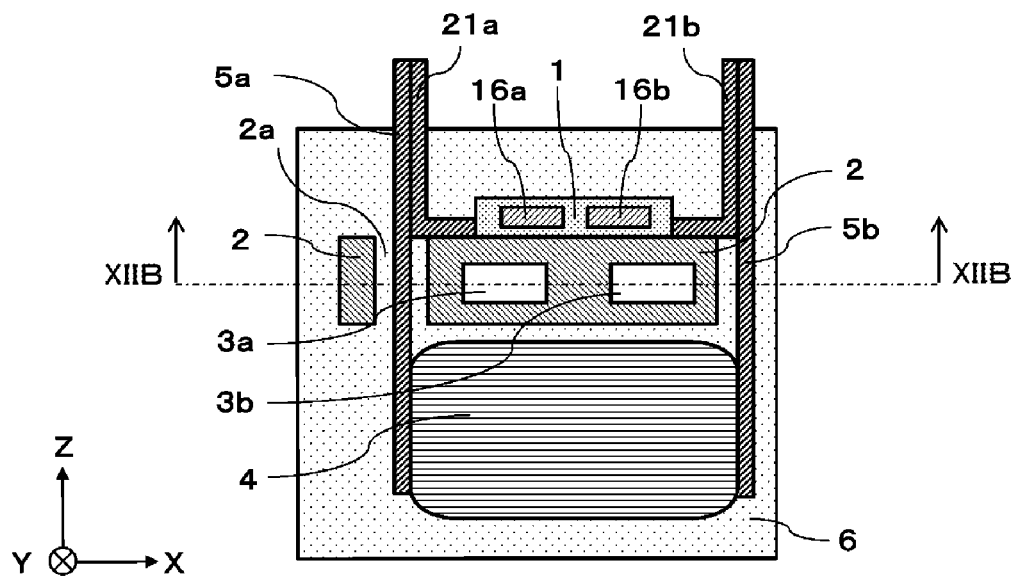
FIG. 12A is a schematic cross-sectional view of a semiconductor device according to a ninth exemplary embodiment, at a position corresponding to the line IIA-IIA in FIG. 1B.
Figure 12B:
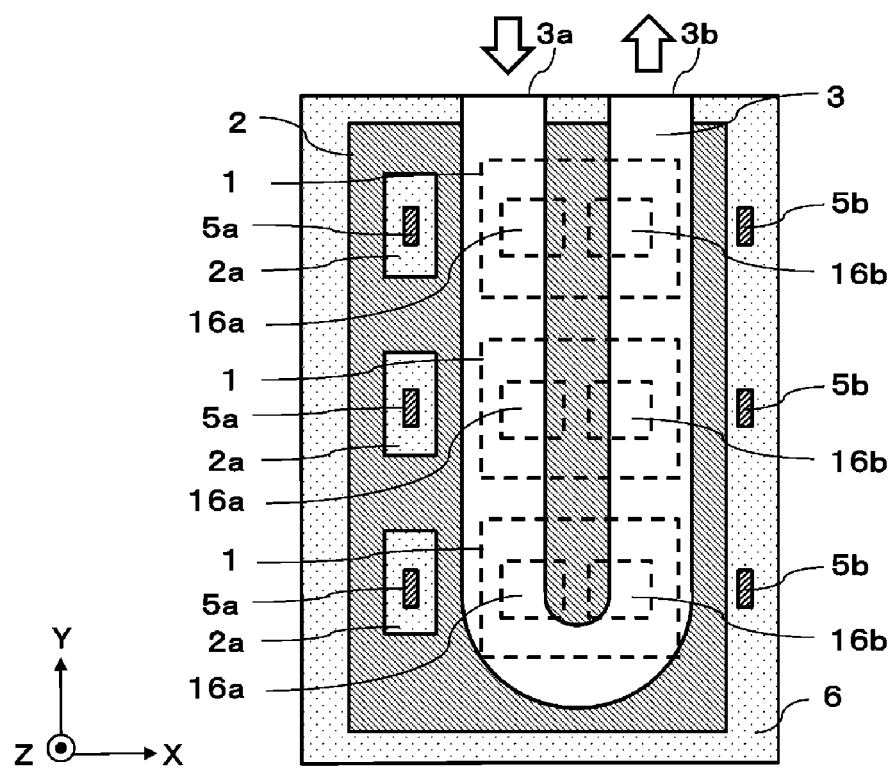
FIG. 12B is a schematic cross-sectional view of the semiconductor device according to the ninth exemplary embodiment, along a line XIIB-XIIB in FIG. 12A.

A configuration of a semiconductor device according to a ninth exemplary embodiment will be described with reference to FIGS. 12A and 12B. FIG. 12A is a schematic cross-sectional view of the semiconductor device according to the ninth exemplary embodiment, at a position corresponding to the line IIA-IIA in FIG. 1B, and FIG. 12B is a schematic cross-sectional view of the semiconductor device according to the ninth exemplary embodiment, along a line XIIB-XIIB in FIG. 12A. As shown in FIGS. 12A and 12B, according to the semiconductor device of the ninth exemplary embodiment, through holes 2a are provided to cooling member 2, and first bus bars 5a extend through through holes 2a of cooling member 2. And first bus bars 5a connect capacitors 4 and semiconductor modules 1. Also, as in the eighth exemplary embodiment, first bus bars 5a are disposed near channel 3 of cooling member 2, on the side of flow inlet 3a. Other configurations are the same as those in the eighth exemplary embodiment.

According to the present exemplary embodiment, first bus bars 5a are connected to P terminals 21a from high-side semiconductor elements 16a whose temperature tends to be increased. Thus, in order to suppress transfer of heat from semiconductor modules 1 to capacitors 4, the amount of heat dissipation from first bus bars 5a is desirably increased. On the other hand, second bus bars 5b are connected to N terminals 21b from low-side semiconductor elements 16b whose temperature tends to be lower than that of high-side semiconductor elements 16a. Thus, the amount of heat dissipation from second bus bars 5b should be small.

Accordingly, in the present exemplary embodiment, by passing first bus bars 5a through through holes 2a of cooling member 2, the amount of heat dissipation from first bus bars 5a, which is connected to P terminals 21a of high-side semiconductor elements 16a generating a great amount of heat, may be increased.

Tenth Exemplary Embodiment

Figure 13A:
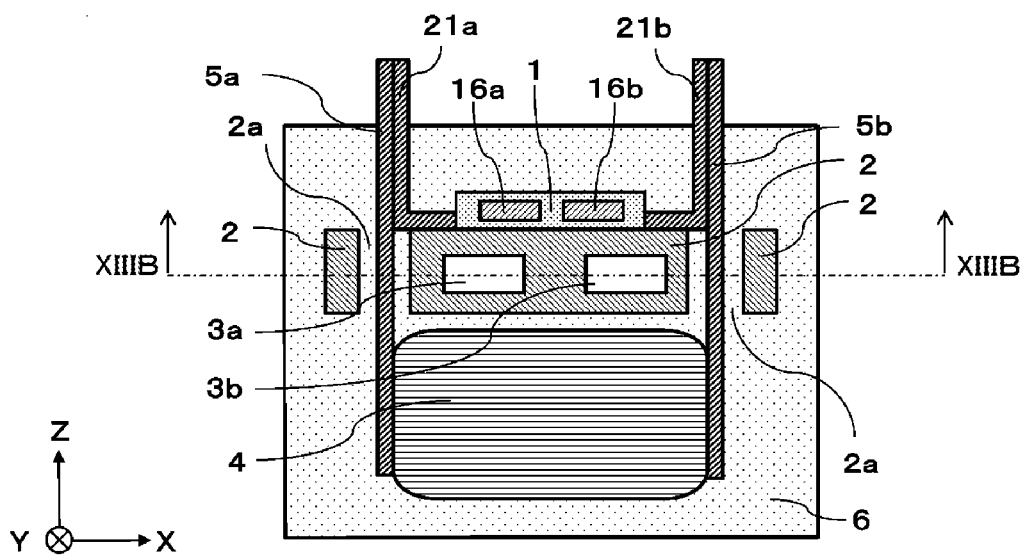
FIG. 13A is a schematic cross-sectional view of a semiconductor device according to a tenth exemplary embodiment, at a position corresponding to the line IIA-IIA in FIG. 1B.
Figure 13B:
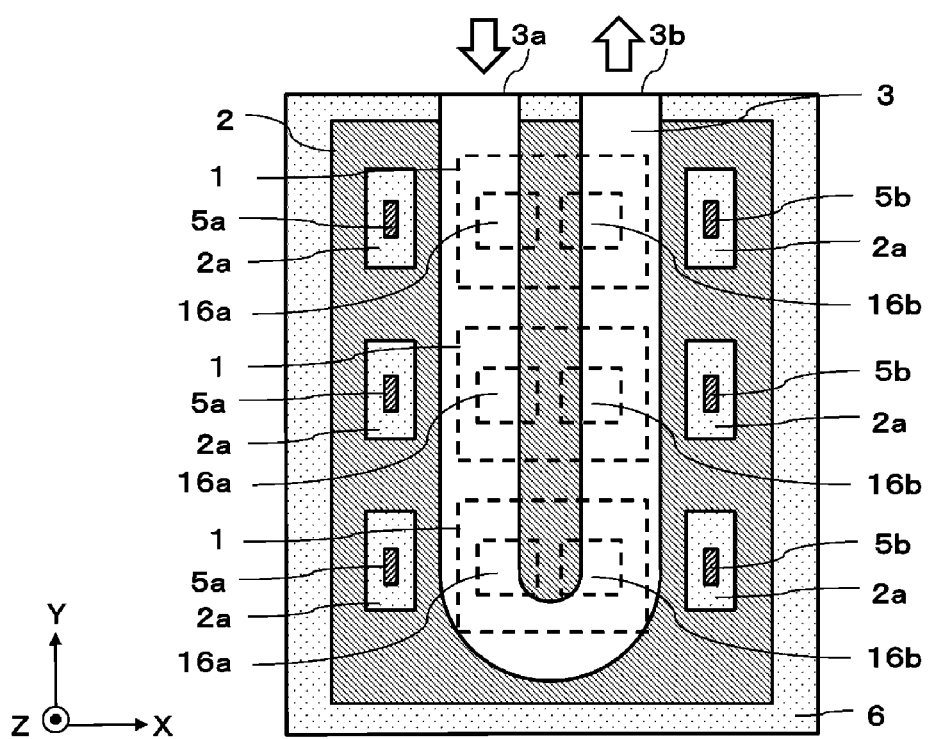
FIG. 13B is a schematic cross-sectional view of the semiconductor device according to the tenth exemplary embodiment, along a line XIIIB-XIIIB in FIG. 13A.

A configuration of a semiconductor device according to a tenth exemplary embodiment will be described with reference to FIGS. 13A and 13B. FIG. 13A is a schematic cross-sectional view of the semiconductor device according to the tenth exemplary embodiment, at a position corresponding to the line IIA-IIA in FIG. 1B, and FIG. 13B is a schematic cross-sectional view of the semiconductor device according to the tenth exemplary embodiment, along a line XIIIB-XIIIB in FIG. 13A. As shown in FIGS. 13A and 13B, according to the semiconductor device of the tenth exemplary embodiment, through holes 2a are provided on both sides of cooling member 2. And each of first bus bars 5a and second bus bars 5b extends through through hole 2a of cooling member 2, and connects capacitors 4 and semiconductor modules 1. As in the eighth exemplary embodiment, first bus bars 5a are disposed near channel 3 of cooling member 2, on the side of flow inlet 3a. Other configurations are the same as those in the eighth exemplary embodiment.

According to the present exemplary embodiment, each of first bus bars 5a and second bus bars 5b is cooled in through hole 2a of cooling member 2, and thus the amount of heat dissipation from the bus bars may be increased.

Various alterations may be made to the configurations of the first to the tenth exemplary embodiments described above. Such variations will be described below.

First Variation

Figure 14A:
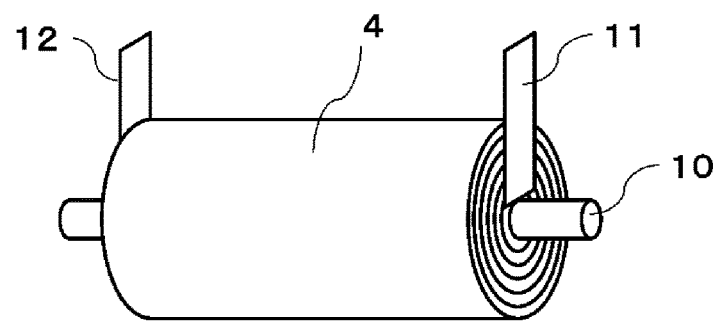
FIG. 14A is a schematic view of a capacitor according to a first variation.
Figure 14B:
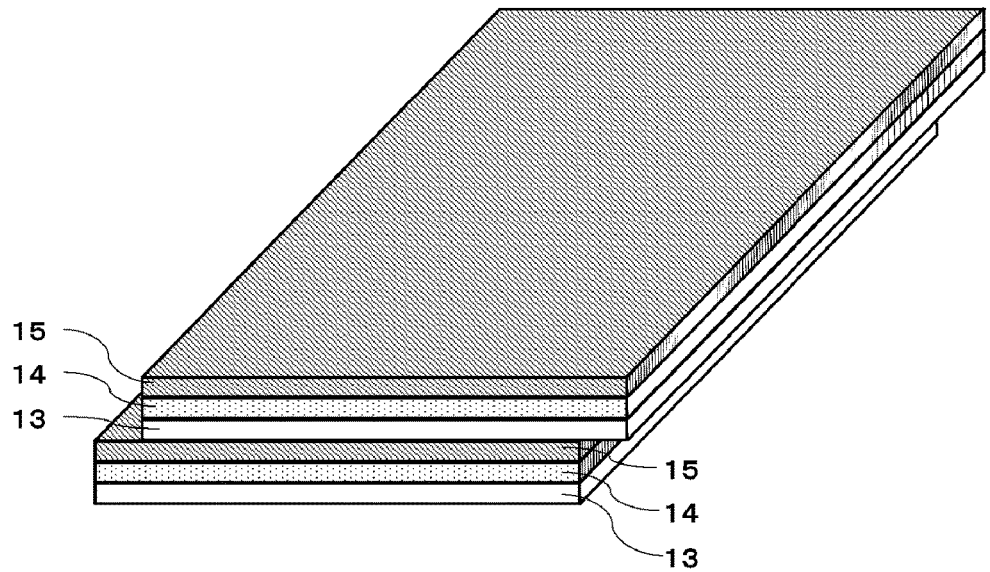
FIG. 14B is an explanatory structural view of the capacitor according to the first variation.

A configuration of a semiconductor device according to a first variation will be described with reference to FIGS. 14A and 14B. FIG. 14A is a schematic view of a capacitor according to the first variation, and FIG. 14B is an explanatory structural view of the capacitor according to the first variation. As described in the first exemplary embodiment, film capacitors are used as capacitors 4 in the exemplary embodiments described above. Capacitors 4 of the exemplary embodiments described above are not provided with a winding shaft at a center, but in the present variation, a rod made of a highly thermal conductive material is used as core rod 10, as shown in FIG. 14A, so as to increase heat dissipation from capacitor 4. As the material of core rod 10, a metal material, such as aluminum, a ceramic material or the like may be used.

Next, a structure of capacitor 4 (film capacitor) according to the present variation will be described with reference to FIG. 14B. As shown in FIG. 14B, capacitor 4 of the present variation has metal thin film 14 of aluminum or the like formed on a surface on one side of insulation film 13 of plastic or the like. Also, to increase heat dissipation, highly thermal conductive carbon sheet 15 is disposed on metal thin film 14. Capacitor 4 shown in FIG. 14A is formed by stacking two laminated bodies, each including insulation film 13, metal thin film 14, and carbon sheet 15, and winding the same around core rod 10. Here, the laminated bodies of insulation film 13, metal thin film 14, and carbon sheet 15 are overlapped while being shifted from each other. And metal thin films 14 on protruding sides are connected to anode extraction electrode 11 and cathode extraction electrode 12, respectively. Accordingly, insulation film 13 is interposed between metal thin film 14 connected to anode extraction electrode 11 and metal thin film 14 connected to cathode extraction electrode 12 so as to function as a capacitor.

In the present exemplary embodiment, since core rod 10 and carbon sheet 15 with high thermal conductivity are used, heat is easily transferred from capacitors 4. Thus, an increase in the temperature of capacitor 4 may be prevented.

Second Variation

Figure 15A:
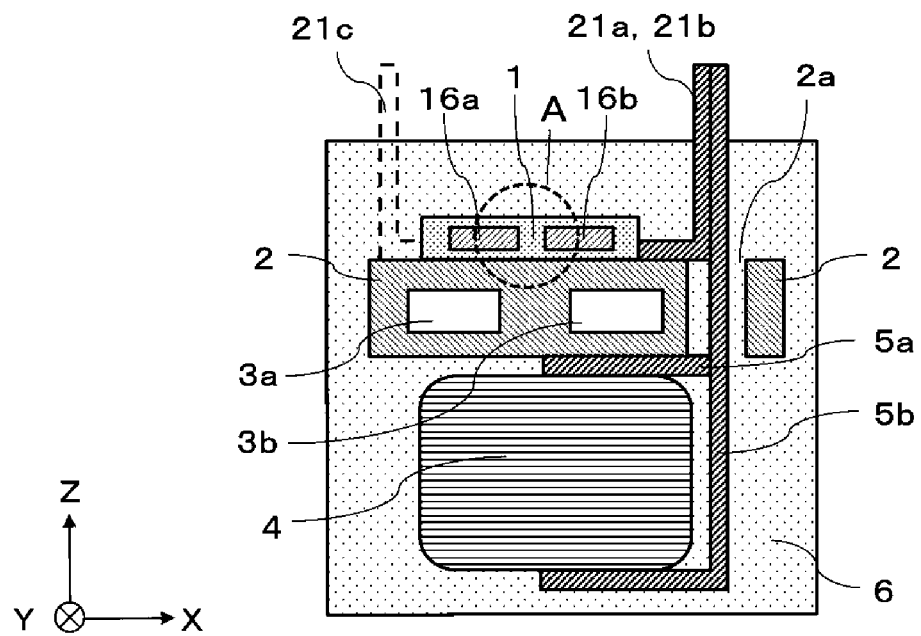
FIG. 15A is a schematic cross-sectional view of a semiconductor device according to a second variation, at a position corresponding to the line IIA-IIA in FIG. 1B.
Figure 15B:
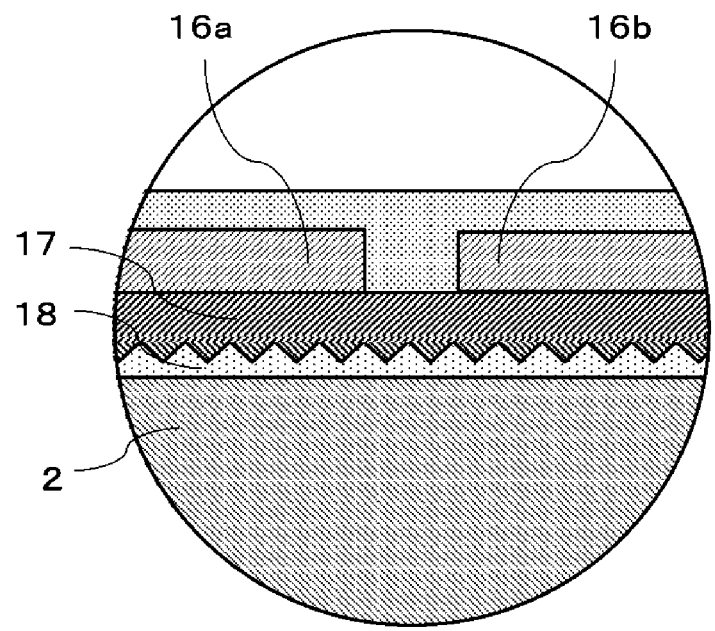
FIG. 15B is a schematic locally-enlarged view of semiconductor elements of the semiconductor device according to the second variation and their surroundings.

A configuration of a semiconductor device according to a second variation will be described with reference to FIGS. 15A and 15B. FIG. 15A is a schematic cross-sectional view of the semiconductor device according to the second variation, at a position corresponding to the line IIA-IIA in FIG. 1B, and FIG. 15B is a schematic locally-enlarged view of semiconductor elements and their surroundings (part A in FIG. 15A). As shown in FIG. 15B, according to the semiconductor device of the second variation, semiconductor module 1 includes semiconductor elements 16a, 16b and base substrate 17. Semiconductor elements 16a, 16b are fixed on base substrate 17. Semiconductor elements 16a, 16b and base substrate 17 are disposed on cooling member 2, and protrusions and recesses are formed on a surface of base substrate 17, on the side of cooling member 2. Also, thermal conductive member 18, such as highly thermal conductive grease or adhesive or a highly thermal conductive sheet, is inserted between base substrate 17 and cooling member 2. Other configurations are the same as those in the first exemplary embodiment.

Heat generated by semiconductor elements 16a, 16b is transmitted to cooling member 2 through base substrate 17 and thermal conductive member 18.

In the present exemplary embodiment, thermal conductive member 18 is inserted between base substrate 17 and cooling member 2. Thus, a layer of air generated between base substrate 17 and cooling member 2 is reduced, and the amount of heat dissipation from base substrate 17 to cooling member 2 is increased. Furthermore, since protrusions and recesses are formed on the surface of base substrate 17, on the side of cooling member 2, the amount of heat dissipation to thermal conductive member 18 is further increased. Thus, a great amount of heat is allowed to flow to cooling member 2.

Eleventh Exemplary Embodiment

Figure 16A:
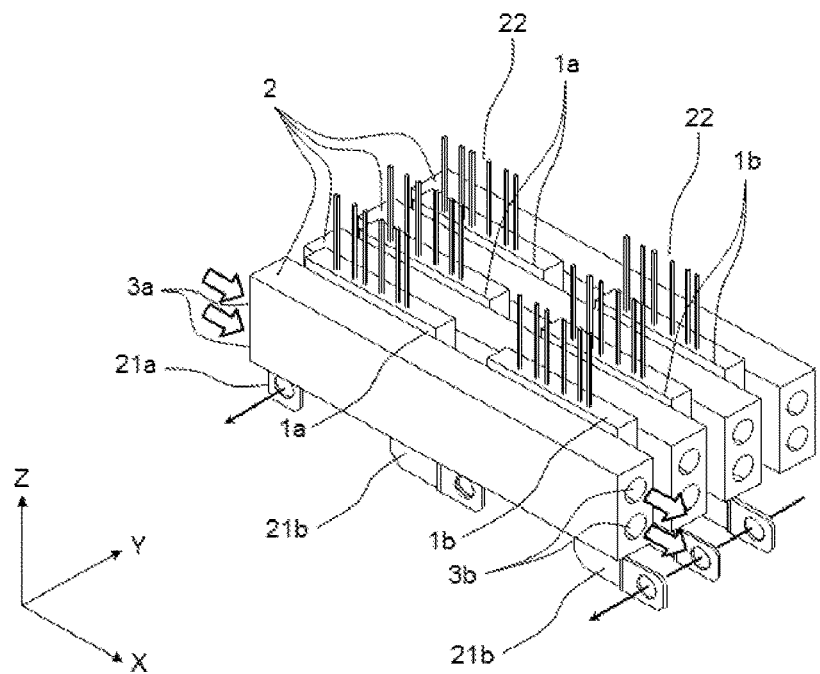
FIG. 16A is a schematic perspective view of a semiconductor device according to an eleventh exemplary embodiment, seen from above.
Figure 16B:
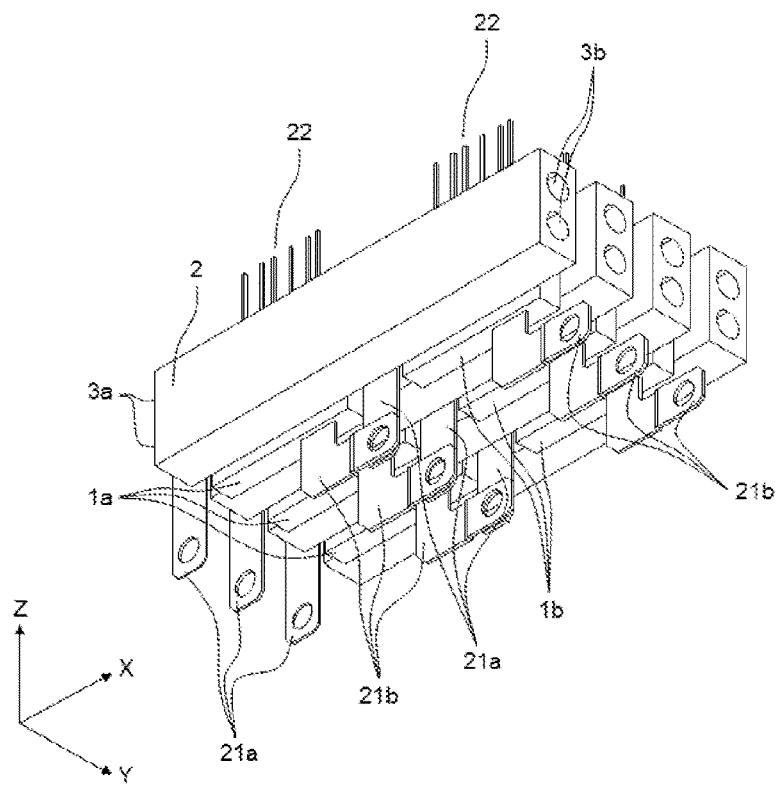
FIG. 16B is a schematic perspective view of the semiconductor device according to the eleventh exemplary embodiment, seen from below.
Figure 17:
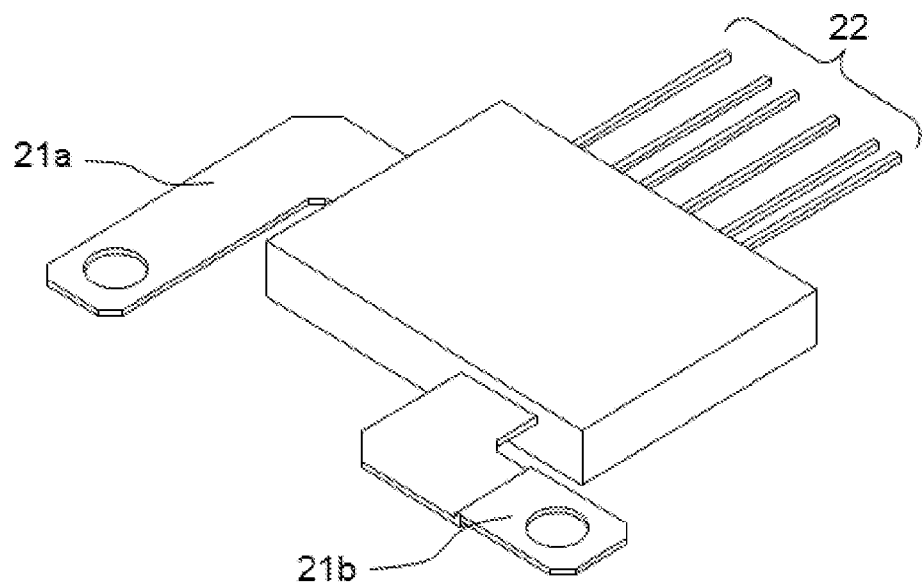
FIG. 17 is a schematic perspective view of a semiconductor module according to the eleventh exemplary embodiment.
Figure 18:
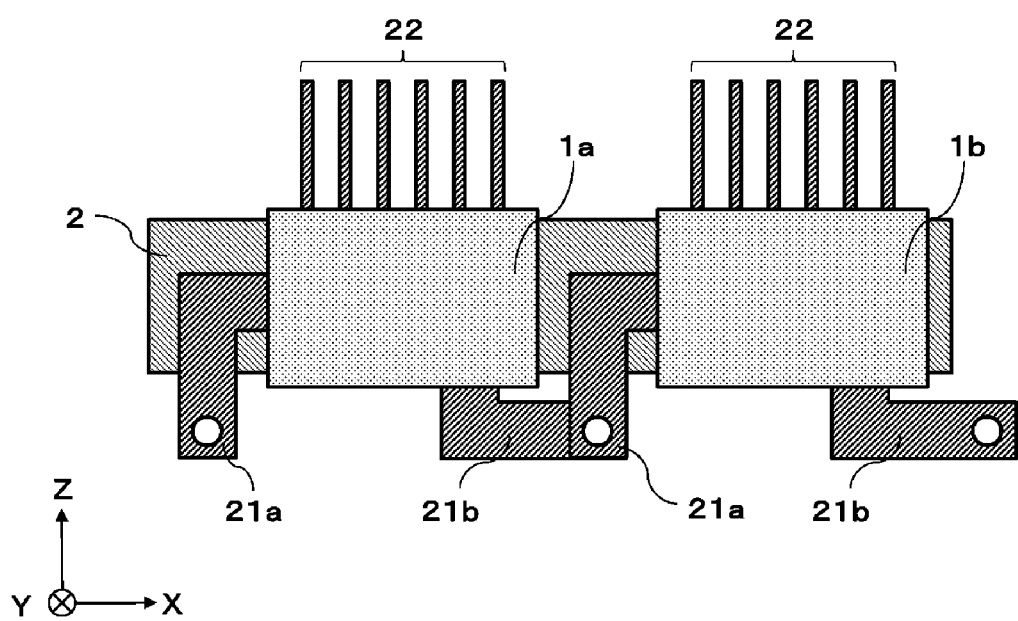
FIG. 18 is a schematic view describing connection between semiconductor modules according to the eleventh exemplary embodiment.
Figure 19:
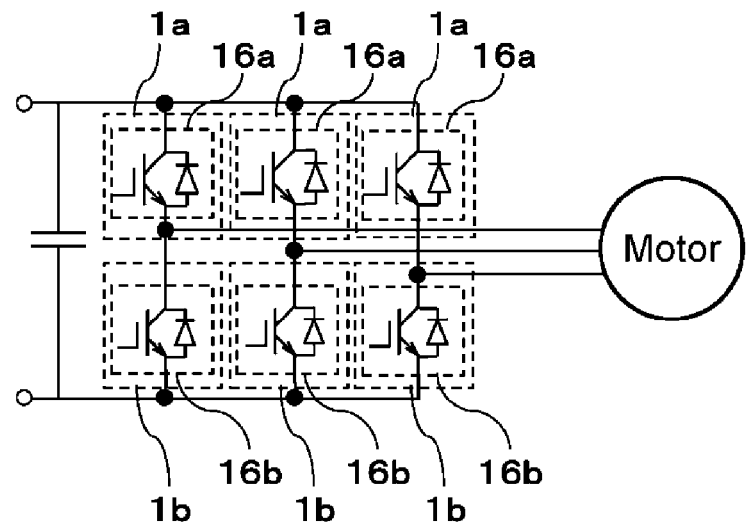
FIG. 19 is a diagram showing a circuit of the semiconductor device according to the eleventh exemplary embodiment.

A configuration of a semiconductor device according to an eleventh exemplary embodiment will be described with reference to FIGS. 16A to 19. FIG. 16A is a perspective view of the semiconductor device according to the eleventh exemplary embodiment, seen from above, and FIG. 16B is a perspective view of the semiconductor device according to the eleventh exemplary embodiment, seen from below. FIG. 17 is a perspective view of a semiconductor module according to the eleventh exemplary embodiment. Also, FIG. 18 is a schematic view describing connection between semiconductor modules according to the eleventh exemplary embodiment, and FIG. 19 is a diagram showing a circuit of the semiconductor device according to the eleventh exemplary embodiment.

In the present exemplary embodiment, high-side semiconductor element 16a and low-side semiconductor element 16b are formed as separate modules. That is, the semiconductor device of the present exemplary embodiment includes semiconductor module 1 in which high-side semiconductor element 16a is incorporated (hereinafter referred to as "high-side semiconductor module 1a") and semiconductor module 1 in which low-side semiconductor element 16b is incorporated (hereinafter referred to as "low-side semiconductor module 1b"). Accordingly, the degree of freedom regarding arrangement of semiconductor modules 1 inside the semiconductor device and regarding circuit configuration may be increased. Here, high-side semiconductor element 16a according to the present exemplary embodiment is an example of a "first semiconductor element" of the present application, and high-side semiconductor module 1a is an example of a "first semiconductor element module" of the present application. Also, low-side semiconductor element 16b according to the present exemplary embodiment is an example of a "second semiconductor element" of the present application, and low-side semiconductor module 1b is an example of a "second semiconductor element module" of the present application.

As shown in FIG. 16A, high-side semiconductor module 1a and low-side semiconductor module 1b are disposed side by side (in the X-direction) on a side surface of cooling member 2. Also, three sets of high-side semiconductor module 1a and low-side semiconductor module 1b are disposed alternately with cooling members 2. Also, all of high-side semiconductor modules 1a are disposed in the same direction (left direction) with respect to low-side semiconductor modules 1b.

As in the case of cooling members 2 described in the first exemplary embodiment and the like, channel 3 (not shown) for allowing a cooling medium to flow is formed inside cooling member 2 of the present exemplary embodiment. A cooling medium flows in from flow inlet 3a formed on a side surface of cooling member 2. The cooling medium passes through channel 3 inside, and flows out from flow outlet 3b formed on an opposite side surface of cooling member 2. Flow inlet 3a for a cooling medium is formed on a side surface, of cooling member 2, nearer to high-side semiconductor module 1a. Though, as in the fourth exemplary embodiment, a shape of channel 3 of cooling member 2 according to the present exemplary embodiment is straight, channel 3 may be shaped to have a curved portion as in the first exemplary embodiment.

Also, as shown in FIG. 16B, high-side semiconductor module 1a and low-side semiconductor module 1b are electrically connected to each other by P terminal 21a, N terminal 21b protruding from semiconductor modules 1.

P terminal 21a, N terminal 21b protruding from semiconductor module 1 will be described with reference to FIG. 17. Here, for the sake of explanation, high-side semiconductor module 1a will be described as a representative example. As shown in FIG. 17, P terminal 21a and N terminal 21b, which are connected to high-side semiconductor element 16a inside and each has a metal plate shape, protrude from side surfaces of high-semiconductor module 1a. Also, signal terminals 22 for control protrude from a side surface. Among P terminal 21a and N terminal 21b, P terminal 21a, which is connected to a positive electrode side, protrudes in a direction orthogonal to a protruding direction of signal terminals 22, and N terminal 21b, which is connected to a negative electrode side, protrudes in a direction opposite the protruding direction of signal terminals 22. After P terminal 21a protrudes in the direction orthogonal to the protruding direction of signal terminals 22, P terminal 21a is bent at a right angle, and extends in a protruding direction of N terminal 21b. On the other hand, after N terminal 21b protrudes in the direction opposite the protruding direction of signal terminals 22, N terminal 21b is bent at a right angle, and extends in a direction opposite a protruding direction of P terminal 21a.

With P terminal 21a and N terminal 21b shaped in the above manner, high-side semiconductor module 1a and low-side semiconductor module 1b may be disposed next to each other, and tip ends of P terminal 21a and N terminal 21b may be made to overlap each other at outside cooling member 2, as shown in FIG. 16B. Since through holes are formed to the tip ends of P terminals 21a and N terminals 21b, circuit for driving a motor, as shown in FIG. 19, may be formed by electrical connection by a metal rod or the like passing through the through holes. Also, since the terminals may be directly connected to each other in the above manner, an increase in the inductance caused by wiring connecting semiconductor modules 1 may be suppressed.

Here, P terminal 21a according to the present exemplary embodiment is an example of a "first power terminal" and a "third power terminal" of the present application, and N terminal 21b is an example of a "second power terminal" and a "fourth power terminal" of the present application.

Connection between high-side semiconductor module 1a and low-side semiconductor module 1b will be described in detail with reference to FIG. 18. As described above, high-side semiconductor module 1a and low-side semiconductor module 1b are disposed side by side (in the X-direction) on side surfaces of cooling members 2. Here, high-side semiconductor module 1a and low-side semiconductor module 1b are disposed with large surfaces (upper and lower surfaces) in contact with cooling members 2. Accordingly, the amount of heat dissipation from semiconductor module 1 to cooling members 2 may be increased, and an increase in the temperature of semiconductor module 1 may be suppressed.

N terminal 21b of high-side semiconductor module 1a is bent toward low-side semiconductor module 1b. On the other hand, P terminal 21a of low-side semiconductor module 1b protrudes toward high-side semiconductor module 1a, and is bent downward (in a direction opposite an arrow in the Z-direction). Accordingly, the tip end of N terminal 21b of high-side semiconductor module 1a and the tip end of P terminal 21a of low-side semiconductor module 1b may be disposed overlapping each other.

Here, P terminal 21a protrudes from semiconductor module 1, in parallel to a direction in which semiconductor modules 1 are disposed next to each other (X-direction). That is, P terminal 21a protrudes at a position facing the side surfaces of cooling members 2. Accordingly, the amount of heat dissipation from a protruding portion of P terminal 21a to cooling members 2 is increased, and an increase in the temperature of semiconductor module 1 may be suppressed.

As described above, according to the semiconductor device of the present exemplary embodiment, a plurality of semiconductor modules 1 are disposed on cooling members 2, and the power terminals (P terminal 21a, N terminal 21b) of semiconductor modules 1 are directly connected so as to suppress an increase in the inductance due to wiring and to suppress an increase in the temperature of semiconductor modules 1.

Twelfth Exemplary Embodiment

Figure 20:
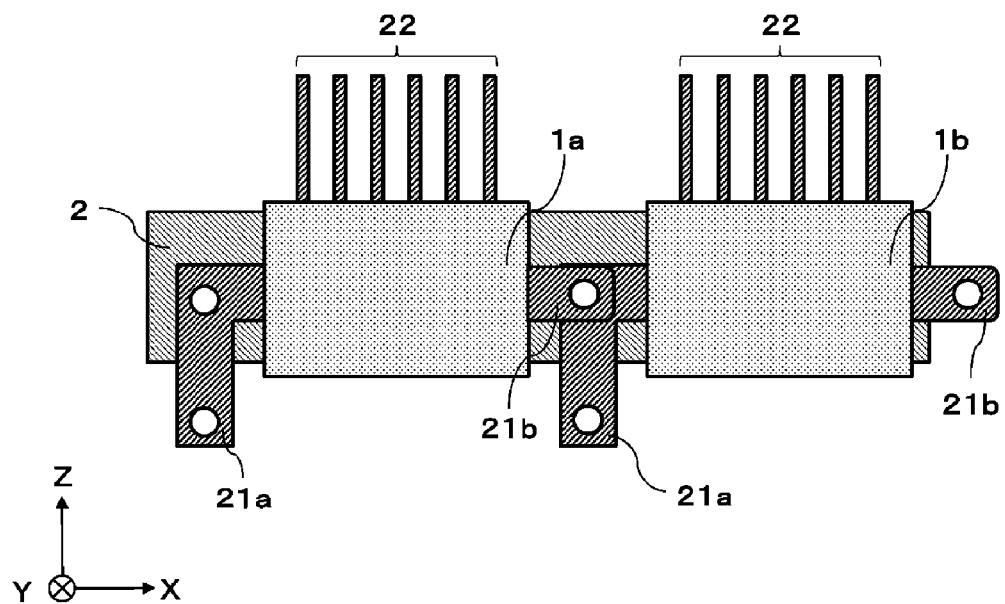
FIG. 20 is a schematic view describing connection between semiconductor modules according to a twelfth exemplary embodiment.

A configuration of a semiconductor device according to a twelfth exemplary embodiment will be described with reference to FIG. 20. FIG. 20 is a schematic view describing connection between semiconductor modules according to the twelfth exemplary embodiment. As shown in FIG. 20, the shape of N terminal 21b of semiconductor module 1 according to the twelfth exemplary embodiment is different from that of semiconductor module 1 according to the eleventh exemplary embodiment. N terminal 21b of semiconductor module 1 according to the present exemplary embodiment protrudes in a direction orthogonal to the protruding direction (Z-direction) of signal terminals 22 and in a direction (X-direction) opposite the protruding direction of P terminal 21a. Other configurations are the same as those in the eleventh exemplary embodiment.

According to such a configuration, by disposing high-side semiconductor module 1a and low-side semiconductor module 1b at predetermined positions, a bent portion of P terminal 21a and the tip end of N terminal 21b may be made to overlap each other. Accordingly, connection may be easily achieved by electrically connecting the overlapped portions of P terminal 21a and N terminal 21b.

Also, compared to semiconductor module 1 according to the eleventh exemplary embodiment, the wiring for connecting semiconductor modules 1 may be reduced. An increase in the inductance due to wiring may thereby be further suppressed.

Furthermore, N terminal 21b protrudes from semiconductor module 1, in parallel to the direction in which semiconductor modules 1 are disposed next to each other. Accordingly, a protruding portion of N terminal 21b is disposed facing the side surfaces of cooling members 2. The amount of heat dissipation from the protruding portion of N terminal 21b to cooling members 2 may thereby be increased.

Additionally, high-side semiconductor modules 1a may be electrically connected by connecting the tip ends of P terminals 21a outside cooling members 2, as in the eleventh exemplary embodiment.

Thirteenth Exemplary Embodiment

Figure 21A:
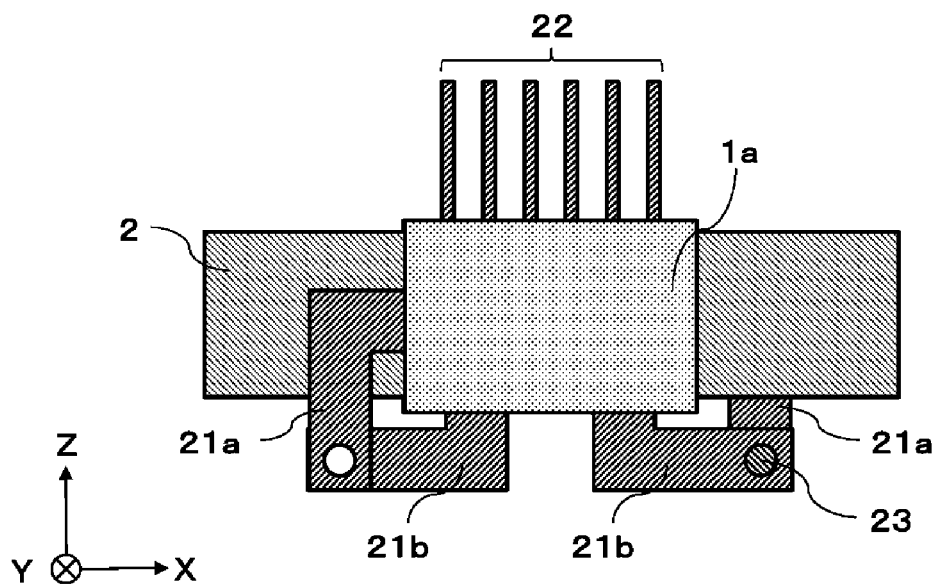
FIG. 21A is a schematic side view of a semiconductor device according to a thirteenth exemplary embodiment.
Figure 21B:
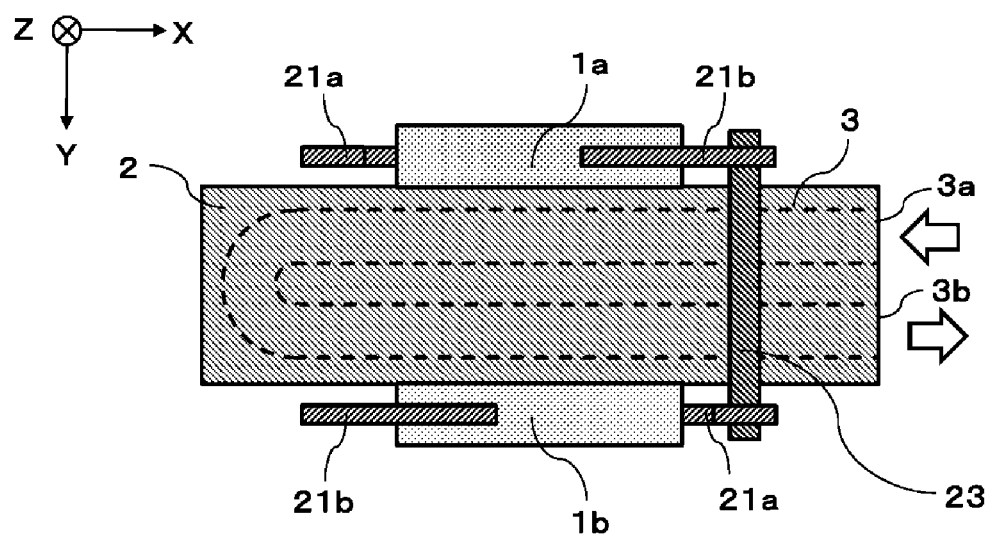
FIG. 21B is a schematic bottom view of the semiconductor device according to the thirteenth exemplary embodiment.

A configuration of a semiconductor device according to a thirteenth exemplary embodiment will be described with reference to FIGS. 21A and 21B. FIG. 21A is a schematic side view of the semiconductor device according to the thirteenth exemplary embodiment, and FIG. 21B is a schematic bottom view of the semiconductor device according to the thirteenth exemplary embodiment. As shown in FIGS. 21A and 21B, according to the semiconductor device of the thirteenth exemplary embodiment, high-side semiconductor module 1a and low-side semiconductor module 1b are disposed facing each other across cooling member 2. That is, high-side semiconductor module 1a is disposed on one side surface of cooling member 2, and low-side semiconductor module 1b is disposed on the other surface (on the opposite side from the one side surface) of cooling member 2.

Moreover, high-side semiconductor module 1a and low-side semiconductor module 1b are disposed in such a way that protruding directions of P terminals 21a are opposite each other. That is, P terminal 21a of high-side semiconductor module 1a protrudes to the left side in the drawing, and P terminal 21a of low-side semiconductor module 1b protrudes to the right side in the drawing. Accordingly, as shown in FIG. 21B, N terminal 21b of high-side semiconductor module 1a and P terminal 21a of low-side semiconductor module 1b may be electrically connected by conductive terminal connection rod 23.

Furthermore, as shown in FIG. 21B, channel 3 curved inside cooling member 2 is formed inside cooling member 2. Channel 3 includes flow inlet 3a on a side surface where high-side semiconductor module 1a is disposed and flow outlet 3b on a side surface where low-side semiconductor module 1b is disposed. Accordingly, since a low-temperature cooling medium entering from flow inlet 3a is allowed to flow through channel 3 near high-side semiconductor module 1a, which generates a great amount of heat, the amount of heat dissipation from high-side semiconductor module 1a may be increased.

As described above, according to the semiconductor device of the present exemplary embodiment, a set of high-side semiconductor module 1a and low-side semiconductor module 1b are compactly integrated with cooling member 2, and by combining such sets, an inverter circuit for driving a motor may be configured, for example.

Fourteenth Exemplary Embodiment

Figure 22A:
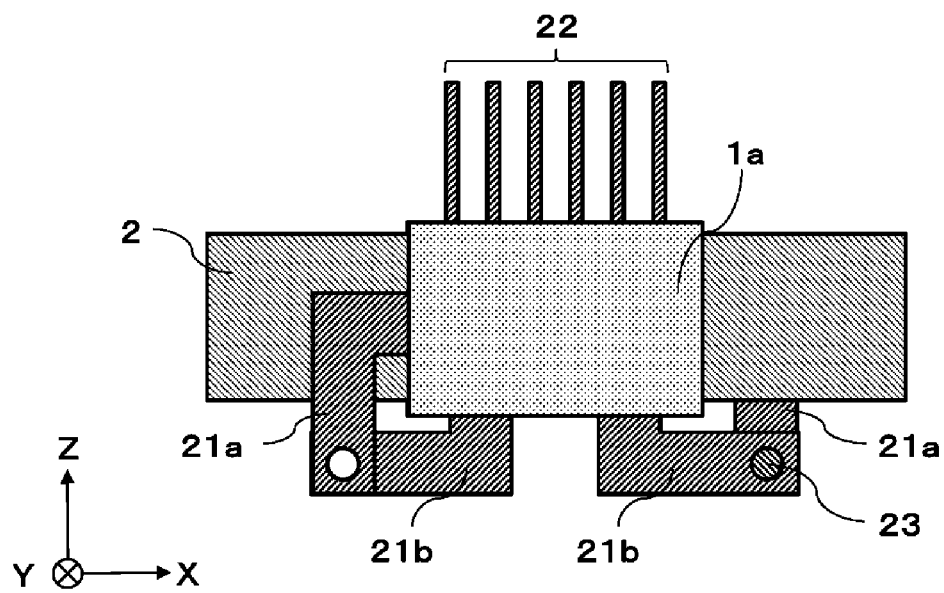
FIG. 22A is a schematic side view of a semiconductor device according to a fourteenth exemplary embodiment.
Figure 22B:
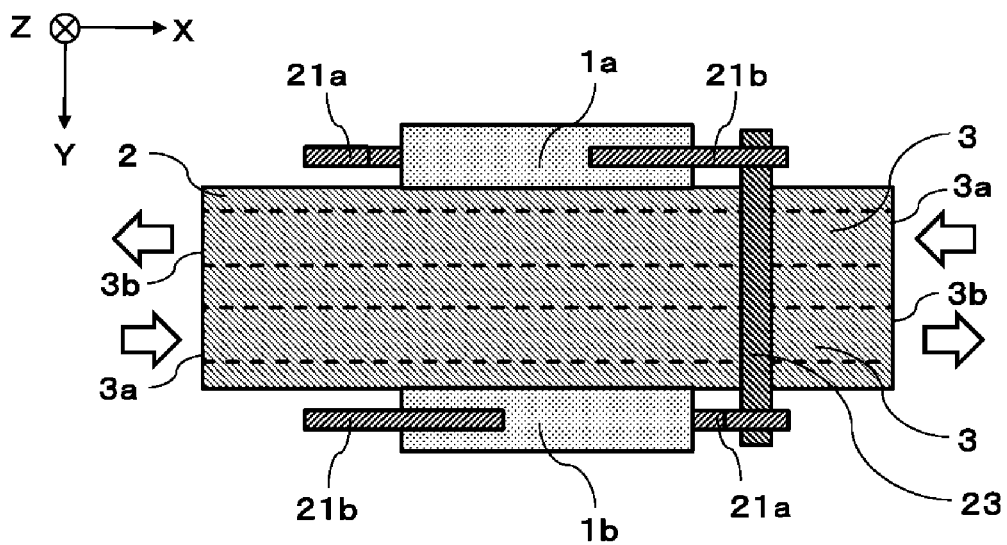
FIG. 22B is a schematic bottom view of the semiconductor device according to the fourteenth exemplary embodiment.

A configuration of a semiconductor device according to a fourteenth exemplary embodiment will be described with reference to FIGS. 22A and 22B. FIG. 22A is a schematic side view of the semiconductor device according to the fourteenth exemplary embodiment, and FIG. 22B is a schematic bottom view of the semiconductor device according to the fourteenth exemplary embodiment. As shown in FIG. 22B, according to the semiconductor device of the fourteenth exemplary embodiment, two channels 3 having straight shapes formed to cooling member 2. Each of channels 3 does not include a curved portion. A cooling medium flows straight, in one direction, from one side surface to the other side surface of cooling member 2. Other configurations are the same as those in the thirteenth exemplary embodiment.

Moreover, the direction of flow of a cooling medium is different between one channel 3 near the side surface where high-side semiconductor module 1a is disposed and the other channel 3 near the side surface where low-side semiconductor module 1b is disposed.

In the present exemplary embodiment, since a plurality of channels 3 are formed to cooling member 2, the cooling capacity is high. Thus, the amount of heat dissipation from semiconductor module 1 may be increased. A downstream side, of one channel, where the temperature of a cooling medium is high is an upstream side of the other channel, and thus high cooling capacity may be achieved on both the upstream sides and the downstream sides of channels 3 of cooling member 2.

Fifteenth Exemplary Embodiment

Figure 23:
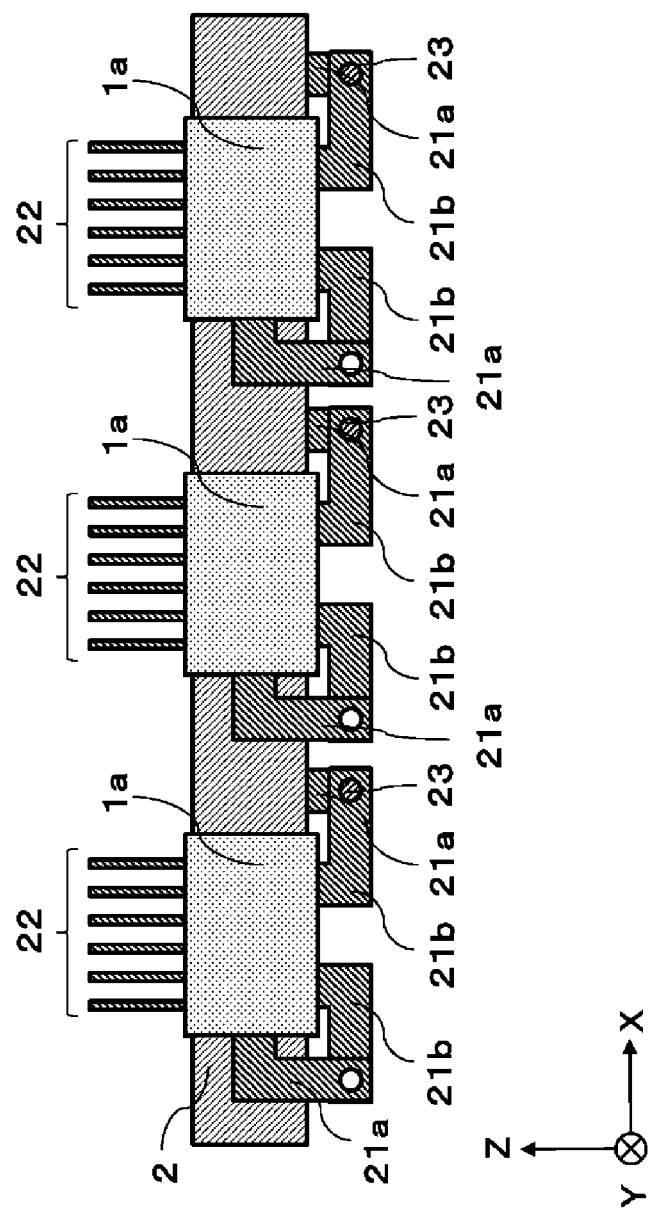
FIG. 23 is a schematic side view of a semiconductor device according to a fifteenth exemplary embodiment.

A configuration of a semiconductor device according to a fifteenth exemplary embodiment will be described with reference to FIG. 23. FIG. 23 is a schematic side view of the semiconductor device according to the fifteenth exemplary embodiment. As shown in FIG. 23, according to the semiconductor device of the fifteenth exemplary embodiment, three sets of high-side semiconductor module 1a and low-side semiconductor module 1b (not shown) of the thirteenth exemplary embodiment are arranged side by side (in the X-direction) for common cooling member 2.

In the present exemplary embodiment, compared to a case where three semiconductor devices of the thirteenth exemplary embodiment are coupled, semiconductor modules 1 may be cooled by one cooling member 2. Thus, the structure is simplified, and also electrical connection between semiconductor modules 1 is facilitated.

Additionally, additional cooling members 2 may be disposed on outside of high-side semiconductor module 1a and outside of low-side semiconductor module 1b, as in the thirteenth exemplary embodiment. The amount of heat dissipation from semiconductor modules 1 may thereby be further increased, and an increase in the temperature of semiconductor modules 1 may be suppressed.

The semiconductor device according to the present disclosure has been described based on exemplary embodiments, but the present disclosure is not limited to the above-described exemplary embodiments. The technology of the present disclosure may be applied to other exemplary embodiments realized by combining constitutional elements of each of the exemplary embodiments, to variations obtained by making, to each exemplary embodiment, various alterations conceived by a person skilled in the art without departing from the spirit of the present disclosure, and to various appliances and systems in which the semiconductor devices of the present disclosure are incorporated.

For example, in the thirteenth to the fifteenth exemplary embodiments, two channels 3 may be vertically formed in cooling member 2, as in the eleventh exemplary embodiment.

The semiconductor device according to the present disclosure is useful mainly as a high-power semiconductor device for driving an electric motor of an electric car or a hybrid car, for example.

What is claimed is:

1. A semiconductor device comprising:
a semiconductor module including a semiconductor element;
a passive element;
a cooling member disposed between the semiconductor module and the passive element; and
a first conductive member and a second conductive member for electrically connecting the semiconductor module and the passive element, wherein:
two or more aspects of at least one of the first conductive member and the second conductive member face the cooling member,
the cooling member includes a through hole, and
at least one of the first conductive member and the second conductive member extends through the through hole of the cooling member.

2. A semiconductor device comprising:
a semiconductor module including a semiconductor element;
a passive element;
a cooling member disposed between the semiconductor module and the passive element; and
a first conductive member and a second conductive member for electrically connecting the semiconductor module and the passive element, wherein:
two or more aspects of at least one of the first conductive member and the second conductive member face the cooling member,
the cooling member includes a cut-out portion, and
at least one of the first conductive member and the second conductive member extends through the cut-out portion of the cooling member.

3. A semiconductor device comprising:
a semiconductor module including a semiconductor element;
a passive element;
a cooling member disposed between the semiconductor module and the passive element; and
a first conductive member and a second conductive member for electrically connecting the semiconductor module and the passive element, wherein:
two or more aspects of at least one of the first conductive member and the second conductive member face the cooling member,
the cooling member is configured from a first cooling member and a second cooling member, and
at least one of the first conductive member and the second conductive member is disposed between the first cooling member and the second cooling member.

4. A semiconductor device comprising:
a semiconductor module including a semiconductor element;
a passive element;
a cooling member disposed between the semiconductor module and the passive element; and
a first conductive member and a second conductive member for electrically connecting the semiconductor module and the passive element, wherein:
two or more aspects of at least one of the first conductive member and the second conductive member face the cooling member, and
the first conductive member at least includes a part with a first width and a part with a second width greater than the first width, the part with the second width being disposed between the cooling member and the passive element.

5. A semiconductor device comprising:
a semiconductor module including a semiconductor element;
a passive element;
a cooling member disposed between the semiconductor module and the passive element; and
a first conductive member and a second conductive member for electrically connecting the semiconductor module and the passive element, wherein:
two or more aspects of at least one of the first conductive member and the second conductive member face the cooling member,
the cooling member includes a channel for allowing a cooling medium to flow,
the channel includes a curved portion, and
a flow inlet of the channel and a flow outlet of the channel are disposed on one side surface of the cooling member.

6. A semiconductor device comprising:
a semiconductor module including a semiconductor element;
a passive element;
a cooling member disposed between the semiconductor module and the passive element; and
a first conductive member and a second conductive member for electrically connecting the semiconductor module and the passive element, wherein:
two or more aspects of at least one of the first conductive member and the second conductive member face the cooling member,
the cooling member includes a channel for allowing a cooling medium to flow,
a flow inlet of the channel is disposed on one side surface of the cooling member, and
a flow outlet of the channel is disposed on the other side surface that is opposite the one side surface of the cooling member.

7. The semiconductor device according to claim 1, wherein:
the passive element is a film capacitor, and
the film capacitor includes a core rod made of a highly thermal conductive material.

8. The semiconductor device according to claim 1, wherein:
the passive element is a film capacitor, and
the film capacitor includes a carbon sheet.

9. The semiconductor device according to claim 1, wherein:
the semiconductor element is disposed on a base substrate, and
the base substrate is disposed on the cooling member across a thermal conductive member.

10. A semiconductor device comprising:
a semiconductor module including a semiconductor element;
a passive element;

a cooling member disposed between the semiconductor module and the passive element; and a first conductive member and a second conductive member for electrically connecting the semiconductor module and the passive element, wherein the first conductive member at least includes a part with a first width and a part with a second width greater than the first width, the part with the second width being disposed between the cooling member and the passive element.

11. A semiconductor device comprising:

a semiconductor module including a semiconductor element;

a passive element;

a cooling member disposed between the semiconductor module and the passive element; and a first conductive member and a second conductive member for electrically connecting the semiconductor module and the passive element, wherein:

the cooling member and the semiconductor module are disposed between the first conductive member and the second conductive member, the cooling member includes a through hole, and at least one of the first conductive member and the second conductive member extends through the through hole of the cooling member.

12. A semiconductor device comprising:

a semiconductor module including a semiconductor element;

a passive element;

a cooling member disposed between the semiconductor module and the passive element; and a first conductive member and a second conductive member for electrically connecting the semiconductor module and the passive element, wherein:

the cooling member and the semiconductor module are disposed between the first conductive member and the second conductive member, the cooling member includes two or more through holes, and the first conductive member and the second conductive member respectively extend through the through holes different from one another.

* * * * *